(12) United States Patent
Chawla et al.

(10) Patent No.: US 11,829,730 B2
(45) Date of Patent: *Nov. 28, 2023

(54) ELEMENTS FOR IN-MEMORY COMPUTE

(71) Applicants: STMICROELECTRONICS S.R.L., Agrate Brianza (IT); STMICROELECTRONICS INTERNATIONAL N.V., Geneva (CH)

(72) Inventors: Nitin Chawla, Noida (IN); Tanmoy Roy, Greater Noida (IN); Anuj Grover, New Delhi (IN); Giuseppe Desoli, San Fermo Della Battaglia (IT)

(73) Assignees: STMICROELECTRONICS S.R.L., Agrate Brianza (IT); STMICROELECTRONICS INTERNATIONAL N.V., Geneva (CH)

(*) Notice: Subject to any disclaimer, the term of this patent is extended or adjusted under 35 U.S.C. 154(b) by 0 days.

This patent is subject to a terminal disclaimer.

(21) Appl. No.: 17/940,654

(22) Filed: Sep. 8, 2022

(65) Prior Publication Data

US 2023/0004354 A1 Jan. 5, 2023

Related U.S. Application Data

(63) Continuation of application No. 16/890,870, filed on Jun. 2, 2020.

(Continued)

(51) Int. Cl.
*G06F 7/57* (2006.01)
*G06F 3/06* (2006.01)
*G06N 3/063* (2023.01)

(52) U.S. Cl.
CPC .............. *G06F 7/57* (2013.01); *G06F 3/0604* (2013.01); *G06F 3/0659* (2013.01); *G06F 3/0673* (2013.01); *G06N 3/063* (2013.01)

(58) Field of Classification Search
None
See application file for complete search history.

(56) References Cited

U.S. PATENT DOCUMENTS 4,667,308 A 5/1987 Hayes et al.
9,779,784 B2 10/2017 Hush
(Continued)

OTHER PUBLICATIONS

Fujiki, et al., "In-Memory Data Parallel Processor", *ASPLOS'18*, Session 1A: New Architectures, 2018, 14 pages.
(Continued)

*Primary Examiner* — Farley Abad
*Assistant Examiner* — Dayton Lewis-Taylor
(74) *Attorney, Agent, or Firm* — SEED INTELLECTUAL PROPERTY LAW GROUP LLP

(57) ABSTRACT

A memory array arranged in multiple columns and rows. Computation circuits that each calculate a computation value from cell values in a corresponding column. A column multiplexer cycles through multiple data lines that each corresponds to a computation circuit. Cluster cycle management circuitry determines a number of multiplexer cycles based on a number of columns storing data of a compute cluster. A sensing circuit obtains the computation values from the computation circuits via the column multiplexer as the column multiplexer cycles through the data lines. The sensing circuit combines the obtained computation values over the determined number of multiplexer cycles. A first clock may initiate the multiplexer to cycle through its data lines for the determined number of multiplexer cycles, and a second clock may initiate each individual cycle. The multiplexer or additional circuitry may be utilized to modify the order in which data is written to the columns.

28 Claims, 12 Drawing Sheets

Related U.S. Application Data

(60) Provisional application No. 62/859,642, filed on Jun. 10, 2019.

(56) References Cited

U.S. PATENT DOCUMENTS

| | | |
|---|---|---|
| 10,068,652 B2 | 9/2018 | Finkbeiner et al. |
| 2010/0155853 A1 | 6/2010 | Yoon |
| 2016/0232951 A1 | 8/2016 | Shanbhag et al. |
| 2018/0364908 A1 | 12/2018 | Lea et al. |
| 2019/0042160 A1 | 2/2019 | Kumar et al. |

OTHER PUBLICATIONS

Kang, et al., "An In-Memory VLSI Architecture for Convolutional Neural Networks," *IEEE Journal on Emerging and Selected Topics in Circuits and Systems*, vol. 8(3), 2018, pp. 494-505.

Mittal, "A Survey of ReRAM-Based Architectures for Processing-In-Memory and Neural Networks", *Machine Learning and Knowledge Extraction*, vol. 1, 2019, pp. 75-114.

Sim, et al., "LUPIS : Latch-Up Based Ultra Efficient Processing In-Memory System", 2018 *19th International Symposium on Quality Electronic Design (ISQED)*, 2018, 6 pages.

ELEMENTS FOR IN-MEMORY COMPUTE

BACKGROUND

Technical Field

The present disclosure generally relates to a memory array, such as a memory array used in a learning/inference machine (e.g., an artificial neural network (ANN)).

Description of the Related Art

It is known that various computer vision, speech recognition, and signal processing applications benefit from the use of learning/inference machines. Learning/inference machines, as discussed in this disclosure, may fall under the technological titles of machine learning, artificial intelligence, neural networks, probabilistic inference engines, accelerators, and the like. Such machines are arranged to quickly perform hundreds, thousands, and millions of concurrent operations. Conventional learning/inference machines can deliver hundreds of teraflops (i.e., one million millions ($10^{12}$) floating-point operations per second) of computing power.

Known computer vision, speech recognition, and signal processing applications benefit from the use of learning/inference machines, such as deep convolutional neural networks (DCNN). A DCNN is a computer-based tool that processes large quantities of data and adaptively "learns" by conflating proximally related features within the data, making broad predictions about the data, and refining the predictions based on reliable conclusions and new conflations. The DCNN is arranged in a plurality of "layers," and different types of predictions are made at each layer.

For example, if a plurality of two-dimensional pictures of faces is provided as input to a DCNN, the DCNN will learn a variety of characteristics of faces such as edges, curves, angles, dots, color contrasts, bright spots, dark spots, etc. These one or more features are learned at one or more first layers of the DCNN. Then, in one or more second layers, the DCNN will learn a variety of recognizable features of faces such as eyes, eyebrows, foreheads, hair, noses, mouths, cheeks, etc.; each of which is distinguishable from all of the other features. That is, the DCNN learns to recognize and distinguish an eye from an eyebrow or any other facial feature. In one or more third and then subsequent layers, the DCNN learns entire faces and higher order characteristics such as race, gender, age, emotional state, etc. The DCNN is even taught in some cases to recognize the specific identity of a person. For example, a random image can be identified as a face, and the face can be recognized as Person_A, Person_B, or some other identity.

In other examples, a DCNN can be provided with a plurality of pictures of animals, and the DCNN can be taught to identify lions, tigers, and bears; a DCNN can be provided with a plurality of pictures of automobiles, and the DCNN can be taught to identify and distinguish different types of vehicles; and many other DCNNs can also be formed. DCNNs can be used to learn word patterns in sentences, to identify music, to analyze individual shopping patterns, to play video games, to create traffic routes, and DCNNs can be used for many other learning-based tasks too.

BRIEF SUMMARY

A system may be summarized as including a memory array having a first plurality of cells arranged as a plurality of rows of cells intersecting a plurality of columns of cells; a plurality of first computation circuits where each first computation circuit, in operation, calculates a computation value from cell values in a corresponding column of cells in the first plurality of cells; a first column multiplexer, which, in operation, cycles through a plurality of data lines that each corresponds to a first computation circuit of the plurality of first computation circuits; a first sensing circuit, which, in operation, obtains the computation values from the plurality of first computation circuits via the first column multiplexer as the first column multiplexer cycles through the plurality of data lines and combines the obtained computation values over a determined number of multiplexer cycles; and cluster cycle management circuitry, which, in operation, determines the determined number of multiplexer cycles based on a number of columns storing data of a compute cluster. The determined number of multiplexer cycles may be less than a plurality of physical data lines of the first column multiplexer.

A computation value may be a partial sum of cell values in a corresponding column and the first sensing circuit, in operation, calculates a first sum from the obtained partial sums via a first set of the plurality of data lines during a first set of cycles of the first column multiplexer and calculates a second sum from the obtained partial sums via a second set of the plurality of data lines during a second set of cycles of the first column multiplexer, wherein the first and second sets of cycles have the determined number of multiplexer cycles. The first column multiplexer, in operation, may cycle through a second plurality of data lines that each corresponds to a respective second computation circuit of a plurality of second computation circuits, where each second computation circuit calculates a partial sum from cell values in a corresponding column of cells in a second plurality of cells. The second plurality of data lines for the first column multiplexer may be provided by a second column multiplexer.

The system may include a plurality of second computation circuits where each second computation circuit, in operation, calculates a computation value from cell values in a corresponding column of cells in a second plurality of cells of the memory array; a second column multiplexer, which, in operation, cycles through a plurality of data lines that each corresponds to a second computation circuit of the plurality of second computation circuits; and a second sensing circuit, which, in operation, obtains the computation values from the plurality of second computation circuits via the second column multiplexer as the second column multiplexer cycles through the plurality of data lines and combines the obtained computation values over the determined number of multiplexer cycles.

The cluster cycle management circuitry, which, in operation, may generate a plurality of control signals in response to a clock signal and may provide the plurality of control signals to the first sensing circuit and to the first column multiplexer to cycle through the plurality of data lines for the determined number of multiplexer cycles for the first sensing circuit to obtain the computation values from the corresponding first computation circuits. The first column multiplexer, in operation, may modify an address of each of the plurality of data lines of the first column multiplexer to write consecutive pluralities of data to the first plurality of cells. The system may include data-line-selection circuitry, which, in operation, selects different cycle orders through the plurality of data lines of the first column multiplexer to write consecutive pluralities of data to the first plurality of cells.

A method may be summarized as including storing data in a plurality of memory cells that are arranged as a plurality of rows of cells intersecting a plurality of columns of cells; computing a plurality of compute values from cell values from the plurality of columns of cells, wherein each respective compute value is computed from cells values from a respective column of cells; determining a number of columns in the plurality of columns of cells storing data for a data compute cluster; selecting a number of multiplexer cycles based on the determined number of columns; generating a result of the data compute cluster by employing a column multiplexer to cycle through a first subset of the plurality of compute values for the selected number of multiplexer cycles and by employing a sensing engine to combine the respective compute values from the first subset of compute values; and outputting the result of the data compute cluster.

The method may include generating a second result of the data compute cluster by employing a second column multiplexer to cycle through a second subset of the plurality of compute values for the selected number of multiplexer cycles and by employing a second sensing engine to combine the respective compute values from the second subset of compute values; and outputting the second result of the data compute cluster. The method may include generating a second result of the data compute cluster by employing the column multiplexer to cycle through a second subset of the plurality of compute values for the selected number of multiplexer cycles and by employing the sensing engine to combine the respective compute values from the second subset of compute values; and outputting the second result of the data compute cluster.

The method may include modifying a number of data lines utilized by the column multiplexer based on the selected number of multiplexer cycles for the data compute cluster. The method may include initiating the column multiplexer to cycle through the first subset of compute values for the selected number of multiplexer cycles in response to a non-memory clock signal; and initiating each cycle for each data line of the column multiplexer for the selected number of multiplexer cycles to obtain the first subset of compute values in response to memory clock signals. The method may include modifying an address of each of a plurality of data lines of the column multiplexer for writing consecutive pluralities of data to the first plurality of cells. The method may include selecting different cycle orders for the column multiplexer to cycle through the plurality of columns of cells for writing consecutive pluralities of data to the plurality of cells.

A computing device may be summarized as including means for storing data in a plurality of cells that are arranged as a plurality of rows of cells intersecting a plurality of columns of cells; means for computing respective computation values from cell values from each respective column of the plurality of columns of cells; means for determining a compute-cluster-cycle size based on a number of columns in the plurality of columns of cells storing data for a data compute cluster; means for cycling through respective computation values for the determined compute-cluster-cycle size; and means for combining the respective computation values to generate a result of the data compute cluster for the determined compute-cluster-cycle size.

The computing device may include means for initiating the cycling through the respective computation values for the determined compute-cluster-cycle size; and means for initiating each cycle for each respective computation value for the determined compute-cluster-cycle size. The computing device may include means for modifying an order in which data is stored in the plurality of columns of cells for writing consecutive pluralities of data to the plurality of cells.

A non-transitory computer-readable medium having contents which cause cluster cycle management circuitry to perform actions, the actions may be summarized as including storing data in a plurality of memory cells that are arranged as a plurality of rows of cells intersecting a plurality of columns of cells; determining a number of columns in the plurality of columns of cells that store data for a compute operation; selecting a number of multiplexer cycles based on the determined number of columns; generating a result of the compute operation by employing a column multiplexer to cycle through a first subset of the plurality of columns of cells for the selected number of multiplexer cycles and by employing a sensing engine to combine the values from the first subset of columns of cells; and outputting the result of the compute operation.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Moreover, some elements known to those of skill in the art have not been illustrated in the drawings for ease of illustration. One or more embodiments are described hereinafter with reference to the accompanying drawings in which.

DETAILED DESCRIPTION

Figure 1:
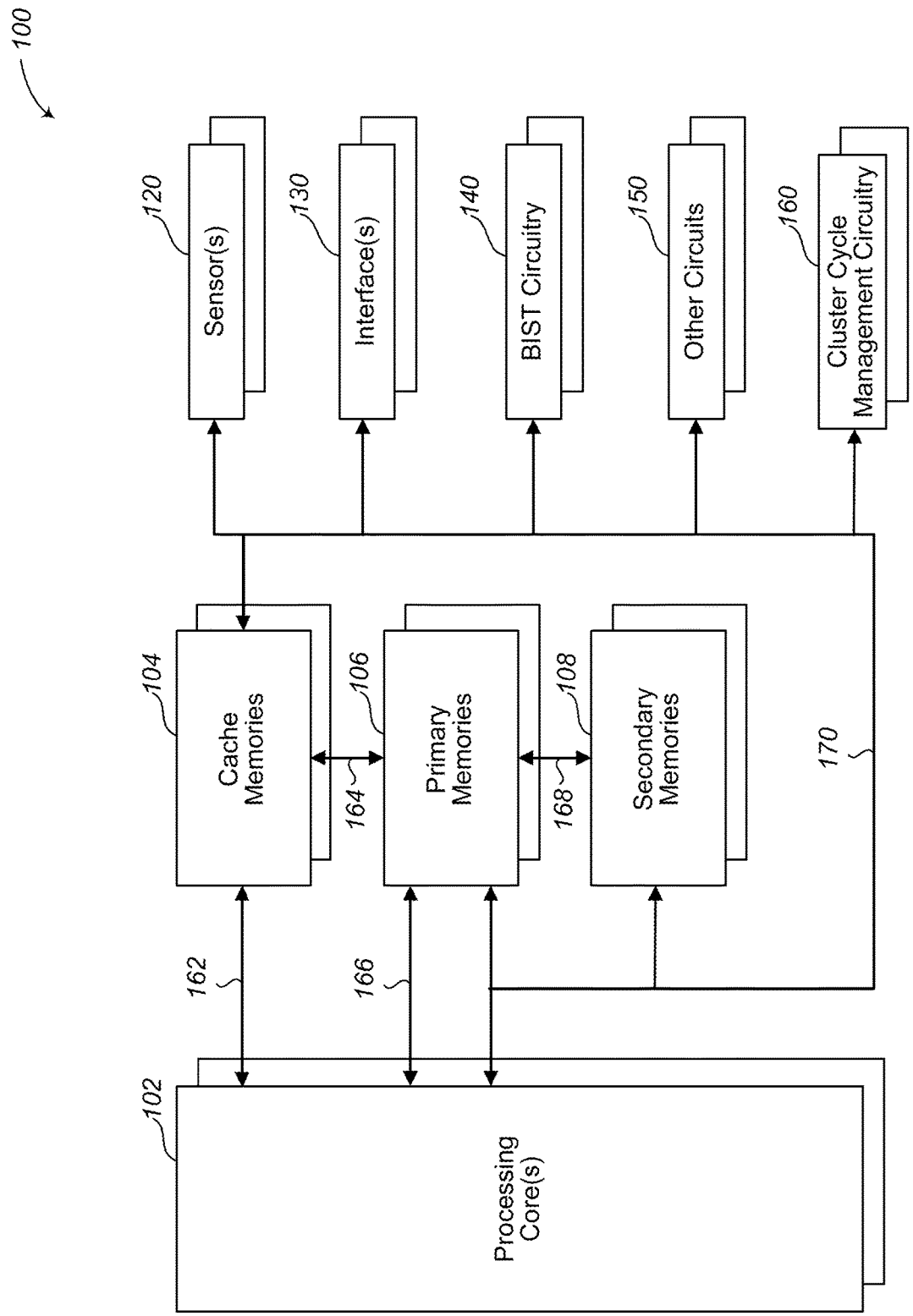
FIG. 1 is a functional block diagram of an embodiment of an electronic device or system having a processing core and a memory according to an embodiment.

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to interfaces, power supplies, physical component layout, etc. in an in-compute memory environment, have not been shown or described in order to avoid unnecessarily obscuring descriptions of the embodiments. Additionally, the various embodiments may be methods, systems, or devices.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

The computations performed by a DCNN, or by other neural networks, often include repetitive computations over large amounts of data. For example, many learning/inference machines compare known information, or kernels, with unknown data, or feature vectors, such as comparing known pixel groupings with a portion of an image. One type of common comparisons are dot products between the kernels and the feature vectors. However, kernel size, feature size, and depth tend to vary across different layers of the neural network. In some instances, dedicated computation units may be used to enable these operations over varying data sets. However, memory utilization may not be fully optimized due to the varying data sets. For example, small swing computations may be enabled by selecting all elements connected to one compute line, whereas large compute clusters may utilize a large number of elements on multiple compute lines, which can lead to bad aspect ratio utilization of the memory. Also, such variations can result in a loss of accuracy due to limited voltage head-room.

FIG. 1 is a functional block diagram of an embodiment of an electronic device or system 100 of the type to which the embodiments, which will be described, may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. As illustrated, the system 100 includes one or more cache memories 104, one or more primary memories 106, and one or more secondary memories 108. One or more of the memories 104, 106, 108 includes a memory array (see, e.g., memory array 202 of FIGS. 2A-2C, memory array 302 in FIGS. 3A-3D, or memory array 402 in FIGS. 4A-4D), which, in operation, is shared by one or more processes executed by the system 100.

The system 100 may include one or more sensors 120 (e.g., image sensors, audio sensors, accelerometers, pressure sensors, temperature sensors, etc.), one or more interfaces 130 (e.g., wireless communication interfaces, wired communication interfaces, etc.), one or more BIST circuits 140, and other circuits 150, which may include antennas, power supplies, etc., and a main bus system 170. The main bus system 170 may include one or more data, address, power and/or control buses coupled to the various components of the system 100. The system 100 also may include additional bus systems such as bus system 162, which communicatively couples the cache memory 104 and the processing core 102, bus system 164, which communicatively couples the cache memory 104 and the primary memory 106, bus system 166, which communicatively couples the primary memory 106 and the processing core 102, and bus system 168, which communicatively couples the primary memory 106 and the secondary memory 108.

The system 100 also includes cluster cycle management circuitry 160, which, in operation, employs one or more memory management routines to utilize configurable multiplexers and sensing circuits to read data from a memory 104, 106, or 108 (see, e.g., FIGS. 2A-2C) or to dynamically write data to the memory of shared memory arrays (see, e.g., FIGS. 3A-3D and 4A-4D). The memory management circuitry 160 may, alone or in combination with other processing (e.g., by processing cores 102), execute routines and functionality described herein, including processes 500-800 in FIGS. 5-8, respectively. The cluster cycle management circuitry 160 may be one or more processors, a state machine, a microprocessor, a programmable logic circuit, discrete circuitry, logic gates, registers, etc., and various combinations thereof.

The primary memory or memories 106 are typically the working memory of the system 100 (e.g., the memory or memories upon which the processing cores 102 work), and may typically be a volatile memory of a limited size storing code and data related to processes executed by the system 100. For convenience, reference herein to data stored in a memory may also refer to code stored in a memory. The secondary memory 108 may typically be a non-volatile memory, which stores instructions and data, which may be retrieved and stored in the primary memory 106 when needed by the system 100. The cache memory 104 may be a relatively fast memory compared to the secondary memory 108 and typically has a limited size, which may be larger than a size of the primary memory 106.

The cache memory 104 temporarily stores code and data for later use by the system 100. Instead of retrieving needed code or data from the secondary memory 108 for storage in the primary memory 106, the system 100 may check the cache memory 104 first to see if the data or code is already stored in the cache memory 104. A cache memory 104 may significantly improve performance of a system, such as the system 100, by reducing the time and other resources needed to retrieve data and code for use by the system 100. When code and data are retrieved (e.g., from the secondary memory 108) for use by the system 100, or when data or code are written (e.g., to the primary memory 106 or to the secondary memory 108), a copy of the data or code may be stored in the cache memory 104 for later use by the system 100. Various cache management routines may be employed to control the data stored in the cache memory or memories 104.

Figure 2A:
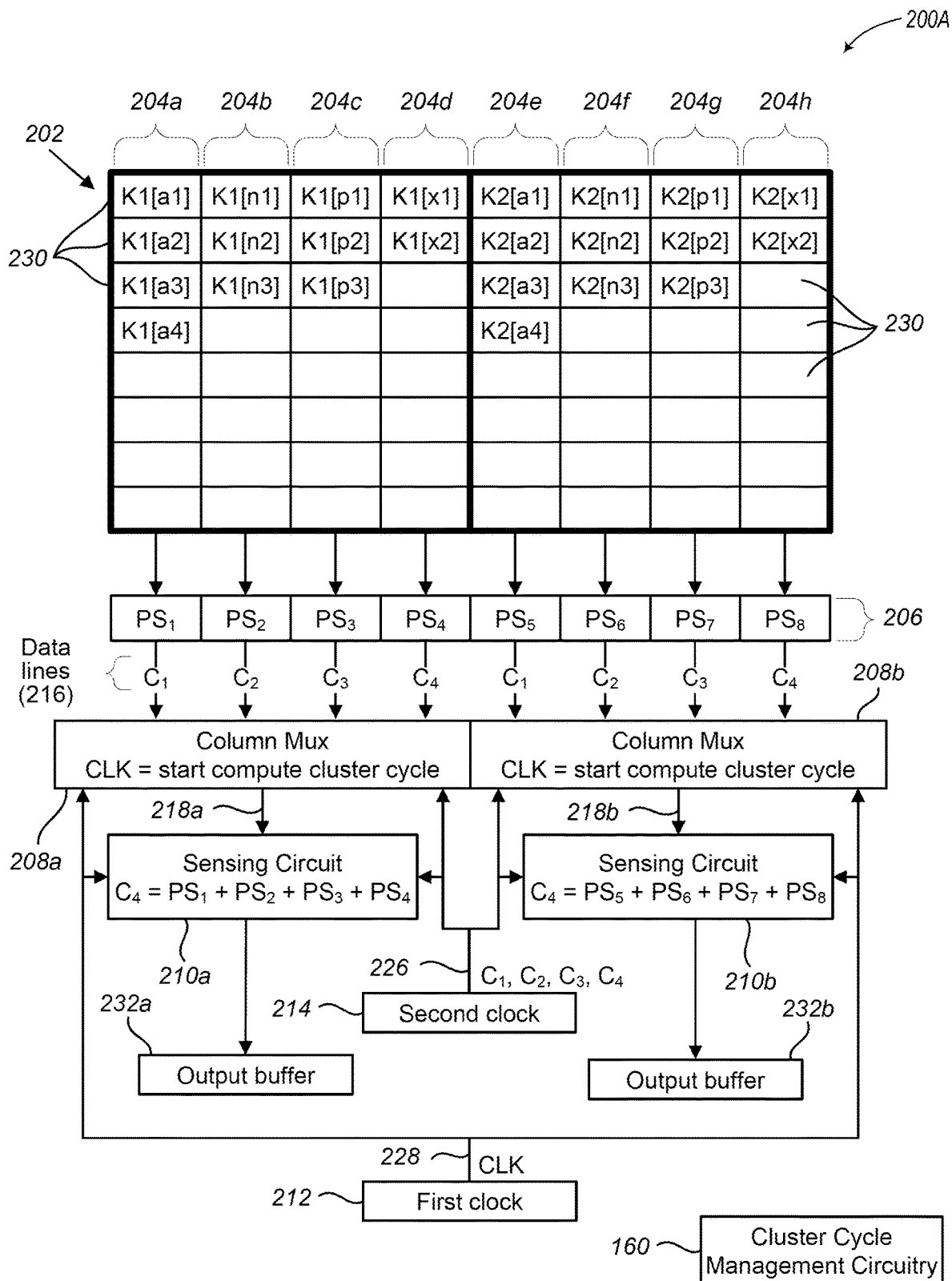
FIGS. 2A-2C illustrate use-case context diagrams of a memory array with configurable multiplexers and sensing circuits.
Figure 2B:
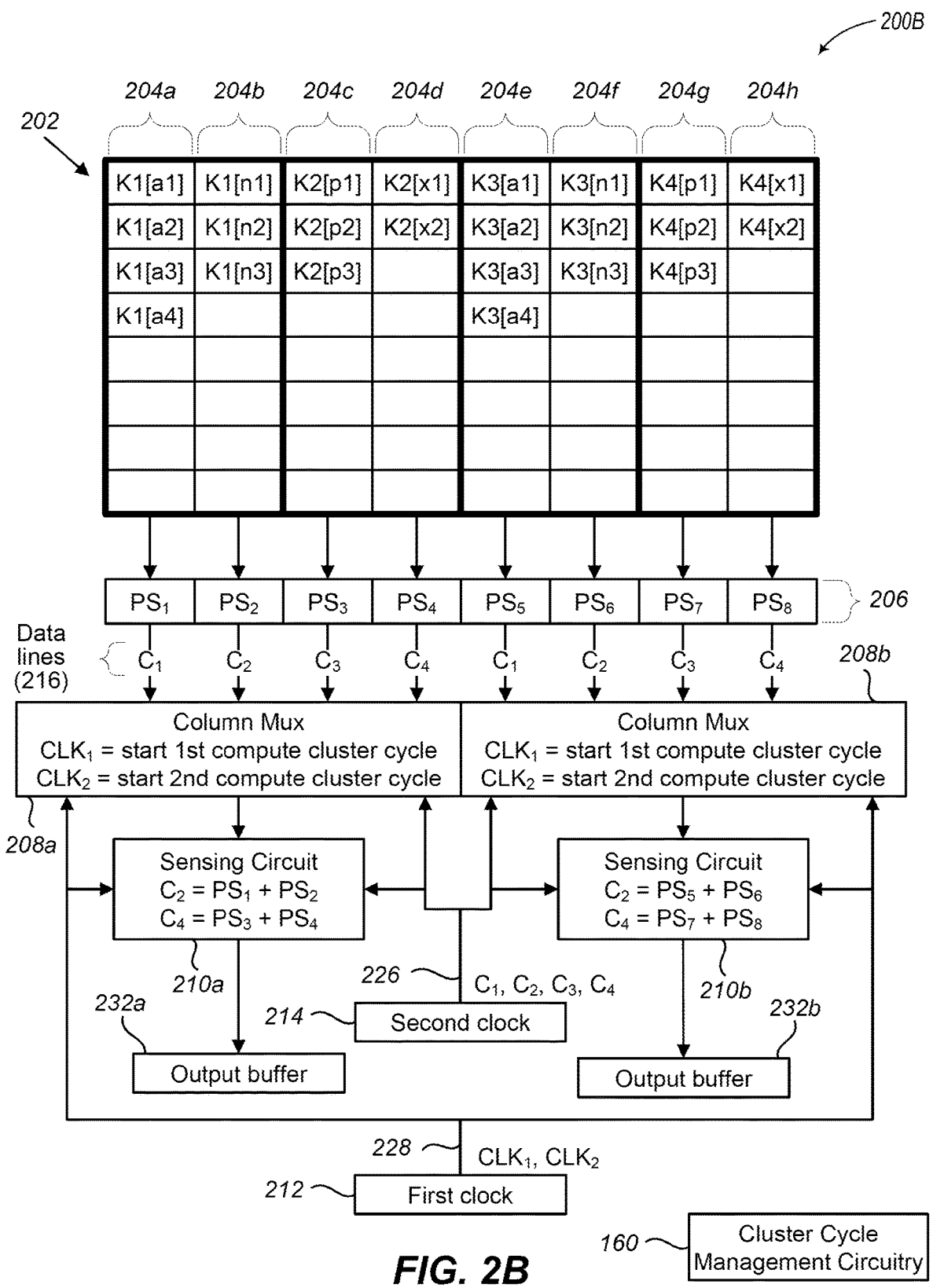
Figure 2C:
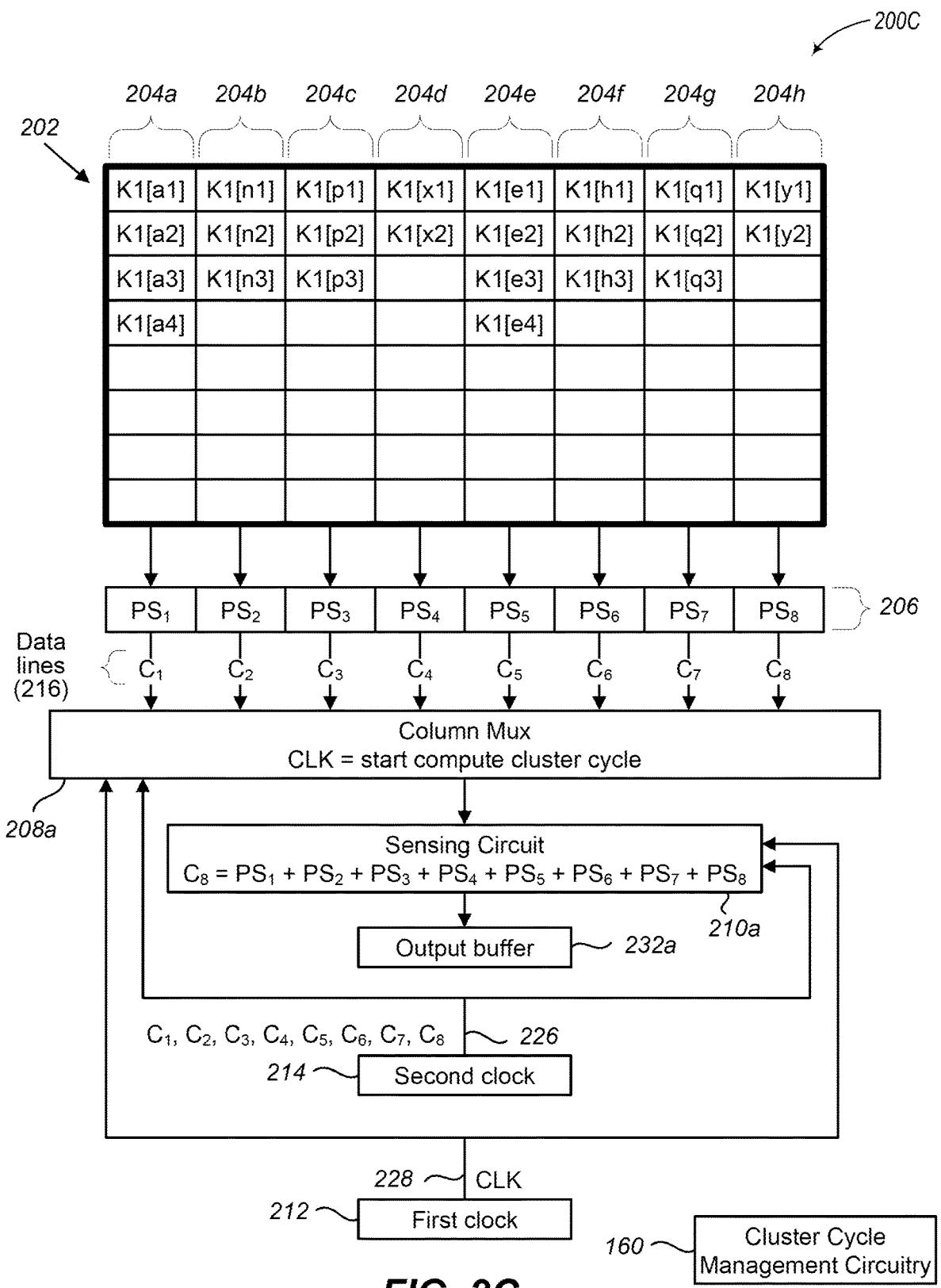

FIGS. 2A-2C illustrate use-case context diagrams of a memory array with configurable multiplexers and sensing circuits for reading data from the memory array. System 200A in FIG. 2A includes a memory array 202, a plurality of computational circuits, as illustrated partial sum circuits 206, one or more column multiplexers 208a-208b, and one or more sensing circuits 210a-210b.

As illustrated, memory 202 includes a plurality of cells 230 configured in a column-row arrangement with a plurality of rows of cells intersecting a plurality of columns of cells. Each cell may be addressable via a particular column and a particular row. The number of cells 230 illustrated in memory array 202 are for illustrative purposes only and systems employing embodiments described herein may include more or fewer cells in more or fewer columns and more or fewer rows. Details of the functionality and components for accessing particular memory cells are known to those skilled in the art and not described herein for conciseness.

Each column 204a-204h of the memory array 202 is in electrical communication with a corresponding partial sum circuit 206. Each partial sum circuit 206 includes circuitry configured to, in operation, calculate or determine the sum of the cell values from each cell 230 in that corresponding column. For example, partial sum $PS_1$ is the sum of the cells 230 in column 204a, the partial sum $PS_2$ is the sum of the cells 230 in column 204b, and so on. In one embodiment, the partial sum circuits 206 may be sample and hold circuits.

Because embodiments described herein can be used for neural network computations, data may be processed in compute clusters. A compute cluster is a plurality of computations performed on a set of data. For example, a compute cluster may include the comparison between kernel data and feature vector data, such as over a preselected number of pixels. In the illustrated embodiment, data is added to the memory 202 such that all the data for a single compute cluster is associated with a same sensing circuit 210a-210b. For example, the data labeled k1[a1], k1[a2], . . . , k1[n1], k1[n2], . . . , k1[p1], k1[p2], . . . , k1[x1], and k1[x2] are for a first compute cluster and are stored in the cells 230 in columns 204a-204d. Conversely, data labeled k2[a1], k2[a2], . . . , k2[n1], k2[n2], . . . , k2[p1], k2[p2], . . . , k2[x1], and k2[x2] are for a second, separate compute cluster and are stored in the cells 230 in columns 204e-204h. In this way, the result obtained by sensing circuit 210a is for one compute cluster and the result obtained by sensing circuit 210b is for another compute cluster.

Each multiplexer 208a-208b includes a plurality of data lines 216 and an output 218a-218b. In the illustrated embodiment, each multiplexer 208a-208b includes four physical data lines 216. Thus, multiplexers 208a-208b are considered to have a physical multiplexer cycle of four. The data lines 216 are illustrated with reference to $C_1$, $C_2$, $C_3$, and $C_4$. These references are not an indication of the values passed along the data lines 216—rather, they refer to a particular clock cycle in which the multiplexers 208a-208b select particular data lines to pass a value from the corresponding partial sum 206 to the respective output 218a-218b. In other embodiments and configurations, the multiplexers may have two physical data lines, eight physical data lines, or other numbers of physical data lines. Moreover, multiplexers 208a-208b are illustrated as read-only multiplexers and configured for reading data from the memory 202. In some embodiments, however, multiplexers 208a-208b may be read/write multiplexers and configured for writing data to the memory 202 and for reading data from the memory 202.

Multiplexers 208a-208b are configured to cycle through the data lines 216 based on a selected number of cycles in a complete compute-cluster cycle. A compute-cluster cycle corresponds to the columns associated with a particular compute cluster. The number of data lines 216 that a multiplexer 208a-208b cycles through for a given compute-cluster cycle is determined based on the compute-cluster-cycle size, which is the number of columns 204 in the memory 202 in which data is stored for a given compute cluster. The cluster-cycle size is independent of the number of physical data line cycles available for each multiplexer. As described above and illustrated in FIG. 2A, the data for a first compute cluster is stored in four columns, columns 204a-204d, and the data for a second compute cluster is stored in four separate columns, columns 204e-204h. In this example, the compute-cluster size is four cycles.

In various embodiments, each multiplexer 208a-208b receives control signals indicating when to initiate cycling through the data lines 216 or when to cycle to each individual data line 216, or a combination thereof. In the illustrated embodiment, the control signals received by multiplexers 208a-208b include, for example, various clock signals. For example, each multiplexer 208a-208b includes a first clock input 228. The first clock input 228 receives one or more clock signals from first clock 212 to cycle through the data lines 216 during a read operation for a given compute-cluster cycle. The first clock 212 may be external or internal to the memory. In some embodiments, the first clock 212 is a system clock.

In some embodiments, the signals received via the first clock input 228 from first clock 212 initialize the multiplexers 208a-208b to cycle through the data lines 216, but each individual data line cycle is triggered by signals received from a second clock 214 via a second clock input 226. In this way, each separate compute-cluster cycle is triggered by a clock signal from the first clock 212. In this illustrated example, the clock signals received from the first clock 212 are examples of cluster control signals that initiate the cycling of a multiplexer and the clock signals received from the second clock 214 are examples of multiplexer cycle control signals that initiate each individual cycle of the multiplexer.

For example, when multiplexer 208a receives clock signal CLK from first clock 212, multiplexer 208a initiates a compute-cluster cycle, which triggers the multiplexer 208a to utilize a next clock signal from the second clock 214 to cycle to a first data line 216. So, when clock signal $C_1$ is received from second clock 214, multiplexer 208a cycles to the data line corresponding to partial sum $PS_1$ so that its partial sum value is obtained by sensing circuit 210a. When clock signal $C_2$ is received from second clock 214, multiplexer 208a cycles to the next data line corresponding to partial sum $PS_2$ so that its partial sum value is obtained by sensing circuit 210a and combined with its previously held value. Multiplexer 208a continues to operate in a similar manner for clock signals $C_3$ and $C_4$ received from second clock 214 for the sensing circuit 210a to obtain the values from PS$_3$ and PS$_4$ and combine the values from PS$_3$ and PS$_4$ with the values from PS$_1$ and PS$_2$.

Likewise, when multiplexer 208b receives clock signal CLK from first clock 212, multiplexer 208b initiates a compute-cluster cycle, which triggers the multiplexer 208b to utilize a next clock signal from the second clock 214 to cycle to a first data line 216. When clock signal C$_1$ is received from second clock 214, multiplexer 208b cycles to the data line corresponding to the partial sum PS$_5$ so that its partial sum value is obtained by sensing circuit 210b. In this example, the clock signal CLK that initiates multiplexer 208b is the same clock signal that initiates multiplexer 208a. In this way, a single clock signal initiates both multiplexers 208a-208b to begin cycling through the corresponding data lines 216. Multiplexer 208b cycles through the data lines corresponding to the partial sums PS$_6$, PS$_7$, and PS$_8$ in response to receipt of clock signals C$_2$, C$_3$, and C$_4$ from second clock 214, so that the partial sum values are obtained and combined by sensing circuit 210b, similar to multiplexer 208a and sensing circuit 210b.

Once the maximum number of multiplexer cycles is reached for a given compute-cluster cycle (e.g., four in the illustrated example in FIG. 2A), the sensing circuits 210a-210b output their obtained values and multiplexers 208a-208b wait for the next first clock signal from first clock 212 to initiate the multiplexers 208a-208b to again cycle through the data lines 216 for a next set of compute-cluster cycles. As a result, system 200A obtains two results for two compute clusters, one by sensing circuit 210a for columns 204a-204d and a second by sensing circuit 210b for columns 204e-204h. And because the multiplexers 208a-208b utilize the same clock signals (first clock signals or a combination of first clock signals and second clock signals) to cycle through their respective data lines 216, the two results for the two compute clusters are obtained during a single compute-cluster cycle.

As illustrated, the multiplexers 208a-208b utilize one clock signal from first clock 212 and four clock signals from second clock 214 to access their corresponding four data lines 216. Embodiments, however, are not so limited. Rather, in other embodiments, receipt of a clock signal from the first clock 212 may instruct the multiplexers 208a-208b to cycle to a first data line 216 and then to a second data line 216 at a next clock signal received from second clock 214. In this way, the second clock 214 is utilized to cycle through each corresponding data line for a given compute-cluster cycle after the first cycle, which, in this illustrated example, the multiplexers 208a-208b would utilize one clock signal from first clock 212 and three clock signals from second clock 214 to access their corresponding four data lines 216.

In at least one embodiment, the second clock 214 may be a memory clock utilized to refresh the data in the memory array 202. In other embodiments, the second clock 214 may be a clock dedicated to the multiplexers 208a-208b or some other clock. The second clock 214 may be external or internal to the memory. In general, the second clock 214 is physically closer to the multiplexers 208a-208b and utilizes less power than the first clock 212 to cycle through the multiplexer data lines. In various embodiments, the second clock signals may be referred to a cycle control signals.

In other embodiments, each signal received via the first clock input 228 from first clock 212 (or some other clock) triggers an individual data line cycle. For example, when multiplexers 208a-208b receive a first clock signal from first clock 212, multiplexer 208a cycles to the data line corresponding to partial sum PS$_1$ so that its partial sum value is obtained by sensing circuit 210a and multiplexer 208b cycles to the data line corresponding to partial sum PS$_5$ so that its partial sum value is obtained by sensing circuit 210b. But when multiplexers 208a-208b receive a second clock signal from first clock 212, multiplexer 208a cycles to the data line corresponding to partial sum PS$_2$ so that its partial sum value is obtained by sensing circuit 210a and multiplexer 208b cycles to the data line corresponding to partial sum PS$_6$ so that its partial sum value is obtained by sensing circuit 210b. Multiplexers 208a-208b continue to operate in a similar manner for additional clock signals received from first clock 212. Once the maximum number of multiplexer cycles is reached for a compute-cluster cycle (e.g., four in the illustrated example in FIG. 1), then the multiplexer 208a cycles back to the first data line on the next clock signal. In such an embodiment, the second clock 214 is optional and is not utilized.

In some embodiments, the multiplexers 208a-208b may have other input/output interfaces (not illustrated), such as for selecting between read and write operations, selecting particular data lines 216, selecting a compute-cluster-cycle size, etc.

For example, as illustrated, the multiplexers 208a-208b utilize the clock signals directly to cycle through the data lines 216. In other embodiments, however, each multiplexer 208a-208b may also include one or more data-selection lines (not illustrated). The data-selection lines are configured to receive an address from selection circuitry to cycle to a particular data line 216. In at least one such embodiment, the selection circuitry utilizes the first clock signals from the first clock 212 or the second clock signals from the second clock 214, or some combination thereof, to cycle through the different data lines 216, as described herein. One example of how such selection circuitry is utilized is illustrated in FIGS. 4A-4D. Although the data-line-selection circuitry illustrated in FIGS. 4A-4D is for instructing a multiplexer to cycle through multiple data lines to write data to the memory, similar circuitry could also be used to instruct a multiplexer to cycle through multiple data lines to read data from the memory.

As another example of other input/output interfaces, the multiplexers 208a-208b may include one or more compute-cluster-cycle-size input lines (not illustrated). The compute-cluster-cycle-size input lines may be utilized to identify how many columns 204 or data lines 216 the multiplexers 208a-208b and sensing circuits 210a-210b are to utilize to obtain results from the memory 202 for a single compute cluster. For example, in the illustrated example in FIG. 2A, the multiplexers 208a-208b utilize four data lines to obtain results from the partial sums for four columns for a single compute cluster. In this example, each multiplexer 208 could have one or more compute-cluster-cycle-size input lines that instruct the multiplexers 208a-208b to operate as a compute-cluster cycle as being four multiplexer cycles or four data lines.

The sensing circuits 210a-210b may also receive clock signals from first clock 212 and second clock 214, similar to multiplexers 208a-208b. These clock signals are used to trigger the sensing circuits 210a-210b on when to obtain a partial sum value being selected by multiplexers 208a-208b and output via outputs 218a-218b for a given compute-cluster cycle. When a compute-cluster cycle is complete, the sensing circuits 210a-210b move their combined stored value into output buffers 232a-232b, respectively, in response to a final clock signal from second clock 214 or in response to a next clock signal from first clock 212. In some embodiments, the sensing circuits 210a-210b may also include one or more compute-cluster-cycle-size input lines (not illustrated) to indicate how many different partial sum values (the number of columns associated with a given compute cluster) are to be obtained for a given compute-cluster cycle, similar to what is described herein for multiplexers 208a-208b.

System 200A also includes a cluster cycle management circuitry 160. In some embodiments, the cluster cycle management circuitry 160 determines the number of multiplexer cycles (e.g., compute-cluster cycle size) to be used for a compute-cluster cycle based on the number of columns storing data for a given compute cluster. In at least one embodiment, the number of columns in which data is stored for a given compute cluster may be based on one or more thresholds compared to the batch size of kernel data for neural network processing. In some embodiments, Kernel sets are partitioned in batches processed sequentially based on the current neural network layer being utilized.

In various embodiments, cluster cycle management circuitry 160 provides information or instructions to multiplexers 208a-208b and sensing circuits 210a-210b regarding the compute-cluster cycle size or the clock signals to utilize (e.g., whether the first clock triggers all multiplexer cycles or whether the first clock initiates the multiplexer cycles to be responsive to second clock signals). In some embodiments, the cluster cycle management circuitry 160 manages or generates the control signals (e.g., the first clock signals and the second clock signals) and provides the control signals to the multiplexers 208a-208b and the sensing circuits 210a-210b. In some embodiments, the cluster cycle management circuitry may coordinate the output of data from the output buffers 232a-232b for further processing, such as input to a next layer in a neural network process.

Although FIG. 2A illustrates embodiments where multiplexers 208a-208b cycle through all four of their physical data lines 216 such that each sensing circuit 210a-210b combines four partial sums during a single compute-cluster cycle, some implementations may have a desire for the sensing circuits 210a-210b to combine fewer partial sums, such as two partial sums. For example, in some situations and implementations, small compute clusters may not optimally utilize the memory when four columns are used due to poor aspect ratio. To improve the aspect ratio, the data for a small compute cluster is stored in two columns, rather than four as described above, and the multiplexers 208a-208b and the sensing circuits reconfigured accordingly, as illustrated in FIG. 2B.

System 200B in FIG. 2B illustrates an embodiment where the configurable multiplexers 208a-208b and sensing circuits 210a-210b utilize two columns in the memory 202 instead of four columns. System 200B is an embodiment of system 200A described in FIG. 2A.

As described above, each column 204a-204h of the memory array 202 is in electrical communication with a corresponding partial sum circuit 206 that is configured to calculate or determine the sum of the cell values from each cell in that corresponding column. In this example, however, the compute clusters are smaller than what is described above in FIG. 2A. In the illustrated embodiment, the data labeled k1[a1], k1[a2], . . . , and k1[n1], k1[n2], . . . are for a first compute cluster and are stored in the cells in columns 204a-204b; the data labeled k2[p1], k2[p2], k2[p3], k2[x1], and k2[x2] are for a second compute cluster and are stored in the cells in columns 204c-204d; the data labeled k3[a1], k3[a2], . . . , and k3[n1], k3[n2], . . . are for a third compute cluster and are stored in the cells in columns 204e204f; and the data labeled k4[p1], k4[p2], k4[p3], k4[x1], and k4[x2] are for a fourth compute cluster and are stored in the cells in columns 204g-204h.

Each multiplexer 208a-208b includes four physical data lines 216. Because each compute cluster is stored in two columns 204 in the memory 202, each multiplexer 208a-208b is reconfigured to cycle through two data lines 216 for a given compute-cluster cycle. As described above, in some embodiments, the signals received via the first clock input 228 from first clock 212 may initialize the multiplexers 208a-208b to cycle through the data lines 216, but each individual data line cycle is triggered by signals received from a second clock 214 via a second clock input 226. The signals from the second clock 214 are utilized such that the number of multiplexer data lines cycled to equals the number of columns utilized for a single compute cluster.

For example, when multiplexer 208a receives clock signal $CLK_1$ from first clock 212 to initiate a compute-cluster cycle, multiplexer 208a cycles to the data line corresponding to partial sum $PS_1$ at the next clock signal $C_1$ received from second clock 214 so that the partial sum value from $PS_1$ is obtained by sensing circuit 210a. When clock signal $C_2$ is received from the second clock 214, multiplexer 208a cycles to the data line corresponding to partial sum $PS_2$ so that its partial sum value is obtained by sensing circuit 210a and combined with its previous held value. After sensing circuit 210a has combined the values from $PS_1$ and $PS_2$, the resulting value is output as the corresponding compute cluster output, such as to output buffer 232a.

Multiplexer 208a then receives a second signal, $CLK_2$, from the first clock 212 to initiate another compute-cluster cycle, which initiates a second compute-cluster cycle. When clock signal $C_3$ is received from second clock 214, multiplexer 208a cycles to the data line corresponding to partial sum $PS_3$ so that its partial sum value is obtained by sensing circuit 210a. When clock signal $C_4$ is received from the second clock 214, multiplexer 208a cycles to the data line corresponding to partial sum $PS_4$ so that its partial sum value is obtained by sensing circuit 210a and combined with its previous held value. After sensing circuit 210a has combined the values from $PS_3$ and $PS_4$, the resulting value is output to output buffer 232a as the corresponding compute cluster output.

Similar to multiplexer 208a, when multiplexer 208b receives clock signal $CLK_1$ from first clock 212 to initiate a compute-cluster cycle, multiplexer 208b cycles to the data lines corresponding to partial sum $PS_5$ and $PS_6$ at the next clock signals, $C_1$ and $C_2$, received from the second clock 214. When clock signal $C_2$ is received from the second clock 214, multiplexer 208b cycles to the data line corresponding to partial sum $PS_6$ so that its partial sum value is obtained by sensing circuit 210b and combined with its previous held value. After sensing circuit 210b has combined the values from $PS_5$ and $PS_6$, the resulting value is output as the corresponding compute cluster output, such as to output buffer 232b.

Multiplexer 208b then receives a second signal, $CLK_2$, from the first clock 212 to initiate another compute-cluster cycle, which initiates a second compute-cluster cycle. When clock signal $C_3$ is received from second clock 214, multiplexer 208b cycles to the data line corresponding to partial sum $PS_7$ so that its partial sum value is obtained by sensing circuit 210b. When clock signal $C_4$ is received from the second clock 214, multiplexer 208b cycles to the data line corresponding to partial sum $PS_8$ so that its partial sum value is obtained by sensing circuit 210b and combined with its previous held value. After sensing circuit 210b has combined the values from $PS_7$ and $PS_8$, the resulting value is output to output buffer 232b as the corresponding compute cluster output.

Once the maximum number of physical multiplexer cycles is reached (e.g., four in the illustrated example in FIG. 2B), then the multiplexers 208a-208b wait for the next first clock signal from first clock 212 to initiate the multiplexers 208a-208b to again cycle through the data lines 216 based on the compute-cluster-cycle size.

As a result, system 200B obtains four results for four compute clusters, one by sensing circuit 210a for columns 204a-204b, a second by sensing circuit 210a for columns 204c-204d, a third by sensing circuit 210b for columns 204e204f, and a fourth by sensing circuit 210b for columns 204g-204h. And because the multiplexers 208a-208b utilize the same clock signals (first clock signals or a combination of first clock signals and second clock signals) to cycle through their respective data lines 216, the first two results for the first two compute clusters (columns 204a-204b and 204e204f) are obtained during a first compute-cluster cycle time and the second two results for the second two compute clusters (columns 204c-204d and 204g-204h) are obtained during a second compute-cluster cycle time.

Similar to what is described above, the multiplexers 208a-208b may utilize clock signals from the first clock 212 to instruct the multiplexers 208a-208b to cycle to a first data line 216 at a next clock signal received from second clock 214 to allow for each multiplexer cycle to be controlled by the clock signals received from the second clock 214, or they can utilize one clock signal from first clock 212 and one clock signal from second clock 214 to access their corresponding two data lines 216 for a given compute cluster, or they may utilize each separate clock signal received from first clock 212 to cycle to a next data line. Likewise, the clock signals received from the first clock 212, the second clock 214, or a combination thereof may be utilized to also trigger the sensing circuits 210a-210b to obtain the current output value of the multiplexers 208a-208b, respectively.

In some embodiments, the number of data lines utilized for a given compute cluster may be controlled by the first clock signals 212. For example, the first clock signal may hold a value of "1" for two second clock signals and then fall to a value of "0." This change to "0" indicates the beginning of a new compute-cluster cycle. In another example, other circuitry (not illustrated) may store the number of columns associated with a given compute-cluster cycle and monitor the number of second clock signals that enabled the multiplexers to cycle to the corresponding number of data lines. Once the number of second clock signals equals the number columns associated with a given compute-cluster cycle, then the other circuitry releases the next first clock signal to initiate a new compute-cluster cycle.

In other embodiments, the multiplexers 208a-208b may have compute-cluster-cycle-size input lines (not illustrated), as described above, which instruct the multiplexers as to the number of columns associated with a given compute-cluster cycle. For example, a single input line may be used such that a "0" indicates two columns and a "1" indicates four columns. Other numbers of compute-cluster-cycle-size input lines may also be used to represent different compute-cluster-cycle sizes. Similarly, the sensing circuits 210a-210b can utilize compute-cluster-cycle-size input lines or clock signals to instruct the sensing circuits to output a currently held value.

Although FIGS. 2A and 2B illustrate embodiments where multiplexers 208a-208b cycle through four data lines 216 such that each sensing circuit 210a-210b combines partial sums for one or more compute-cluster cycles, some implementations may have a desire for a sensing circuit to combine more partial sums, such as eight partial sums. For example, in some situations and implementations, very large compute clusters may not optimally utilize the memory when two or four columns are used due to poor aspect ratio. To improve the aspect ratio, the data for a large compute cluster may be stored in eight columns, rather than two or four as described above, which is illustrated in FIG. 2C.

System 200C in FIG. 2C illustrates an embodiment where the configurable multiplexers 208a-208b and sensing circuits 210a-210b are reconfigured to utilize eight columns in the memory 202 instead of two or four columns, as described above. System 200C is an embodiment of system 200A described in FIG. 2A and system 200B described in FIG. 2B.

As described above, each column 204a-204h of the memory array 202 is in electrical communication with a corresponding partial sum circuit 206 that is configured to calculate or determine the sum of the cell values from each cell in that corresponding column. In this example, however, the compute clusters are larger than what is described above in FIGS. 2A and 2B. In the illustrated embodiment, the data labeled k1[a1], . . . , k1[a4], k1[n1], . . . , k1[n3], k1[p1], . . . , k1[p3], k1[x1], k1[x2], k1[e1], . . . , k1[e4], k1[h1], . . . , k1[h3], k1[q1], . . . , k1[q3], k1[y1], and k1[y2] are for a compute cluster and are stored in the cells in columns 204a-204h.

In this illustrated example, however, the multiplexer 208a is reconfigured to have eight data lines 216. In some embodiments, the multiplexer 208a is reconfigured such that the additional data lines are provided by circuitry that was previously used as another multiplexer. In other embodiments, a second multiplexer (e.g., multiplexer 208b in FIG. 2A or 2B) is controlled or "slaved" by the multiplexer 208a to utilize its data lines. For example, the multiplexer 208a may provide the clock signals to the second multiplexer after the multiplexer 208a has cycled through its physical data lines.

As described above, in some embodiments, the signals received via the first clock input 228 from first clock 212 may initialize the multiplexer 208a to cycle through the data lines 216, but each individual data line cycle is triggered by signals received from a second clock 214 via a second clock input 226. The signals from the second clock 214 are utilized such that the number of multiplexer data lines cycled to equals the number of columns utilized for a single compute-cluster cycle.

For example, when multiplexer 208a receives clock signal CLK from first clock 212 to initiate a compute-cluster cycle, multiplexer 208a waits for clock cycle $C_1$ from the second clock 214 to cycle to the data line 216 corresponding to partial sum $PS_1$. When clock signal $C_2$ is received from the second clock 214, multiplexer 208a cycles to the data line corresponding to partial sum $PS_2$ so that its partial sum value is obtained by sensing circuit 210a and combined with its previous held value. The multiplexer 208a continues to cycle to the other data lines 216 corresponding to partial sums $PS_3$, $PS_4$, $PS_5$, $PS_6$, $PS_7$, and $PS_8$ so that their partial sum values are obtained and combined by sensing circuit 210a in response to clock signals $C_3$, $C_4$, $C_5$, $C_6$, $C_7$, and $C_8$ from second clock 214.

After sensing circuit 210a has combined the values from $PS_1$ through $PS_8$, the resulting value is output as the corresponding compute cluster output, such as to output buffer 232a. Once the maximum number of multiplexer cycles is reached for the compute-cluster cycle (e.g., eight in the illustrated example in FIG. 2C), then the multiplexer 208a waits for the next first clock signal from first clock 212 to initiate the multiplexer 208a to again cycle through the data lines 216.

Similar to what is described above, the multiplexer 208a may utilize clock signals from the first clock 212 to instruct the multiplexer 208a to cycle to a first data line 216 at a next clock signal received from second clock 214 to allow for each multiplexer cycle to be controlled by the clock signals received from the second clock 214, or the multiplexer 208a can utilize one clock signal from first clock 212 and seven clock signals from second clock 214 to access the data lines 216 for the compute cluster, or the multiplexer 208a may utilize each separate clock signal received from first clock 212 to cycle to a next data line. As discussed above, the multiplexer 208a may utilize one or more compute-cluster-cycle-size input lines (not illustrated) to reconfigured the multiplexer 208a to the correct number of data lines for the given compute-cluster-cycle size. Likewise, the clock signals received from the first clock 212, the second clock 214, or a combination thereof may be utilized to also trigger the sensing circuit 210a to obtain the current output value of multiplexer 208a. It should be recognized that other numbers of multiplexers 208a-208b, sensing circuits 210a-210b, and partial sum circuits 206 may be utilized for other sizes of memory 202. Similarly, other numbers of physical data lines may be utilized by multiplexers 208a-208b, as well as different compute-cluster cycle sizes. Moreover, partial sum circuits 206 may obtain the mathematical sum of each cell value in a corresponding column 204 in the memory 202. In some embodiments, however, the partial sum circuits 206 may obtain other mathematical combinations of cell values, such as multiplication.

Although embodiments in FIGS. 2A-2C are described as using clock signals from the first clock 212 and the second clock 214 to read data from the memory 202, embodiments are not so limited. In some embodiments, similar clock signals may also be utilized to write data to the memory, such as illustrated and described in conjunction with FIGS. 3A-3D and 4A-4D.

Moreover, FIGS. 2A-2C illustrate embodiments of determining and utilizing a number of multiplexer cycles to employ during a read operation based on the number of columns storing data for a given compute cluster, where the number of multiplexer cycles can be less than, equal to, or more than the number of physical data lines of the multiplexer. In some other embodiments, the multiplexer may cycle through a determined number of multiplexer cycles that is less than, equal to, or more than the number of physical data lines of the multiplexer during a write operation. For example, in some embodiments, the cluster cycle management circuitry 160 may compare a kernel batch size for a given compute cluster to one or more thresholds to determine the number of columns in which to store the kernel data for the given compute cluster. In one such embodiment, each threshold may corresponding to a particular number of multiplexer cycles—e.g., if the batch size is less than a first threshold then the number of multiplexer cycles is two, if the batch size is greater than the first threshold but less than a second threshold then the number of multiplexer cycles is four, and if the batch size is greater than the second threshold then the number of multiplexer cycles is eight. Other numbers of thresholds and corresponding number of multiplexer cycles may also be utilized, which may vary based on the neural network layer or processing being performed.

The embodiments described above in conjunction with FIGS. 2A-2C illustrate various embodiments for utilizing configurable multiplexers to read data from a memory, while also performing computations on the values read from the memory—such as obtaining partial sums and combining the partial sums for a given compute cluster—in high data processing neural network environments.

To read such amounts of data from memory, the incoming data needs to be written to the memory. As mentioned above, neural networks often involve many similar computations on large amounts of data. Moreover, neural networks are designed to learn specific characteristics from large amounts of training data. Some of this training data will be useful, while others will not. As a result, erroneous data should eventually be removed from the system as the system learns. Some situations, however, can result in erroneous training or input data. For example, if consecutive images are read into memory in the same manner then the same pixel location is stored in the same memory location. But if a pixel becomes "dead" (e.g., by a malfunctioning photo sensor or related circuitry or a failed memory cell), then that memory location will always have the same value. As a result, it is possible that the system may learn the "dead" pixel as part of the training process or be unable to correctly process consecutive input images.

FIGS. 3A-3D illustrate use-case context diagrams of the use of a shifting or line-shifting multiplexer 308 for consecutive writes of a plurality of data to a memory array 302 according to an embodiment. The shifting multiplexer or line-shifting multiplexer refers to a multiplexer that includes circuitry that, in operation, causes the multiplexer itself to change the address of each physical data line of the multiplexer or to modify the selection of physical data lines for consecutive data writes. In various embodiments, the multiplexer 308 includes a barrel shifter that modifies the internal address of each data line 316 for consecutive data writes of a plurality of data. The multiplexer 408 may be a write only or a read-write multiplexer.

Figure 3A:
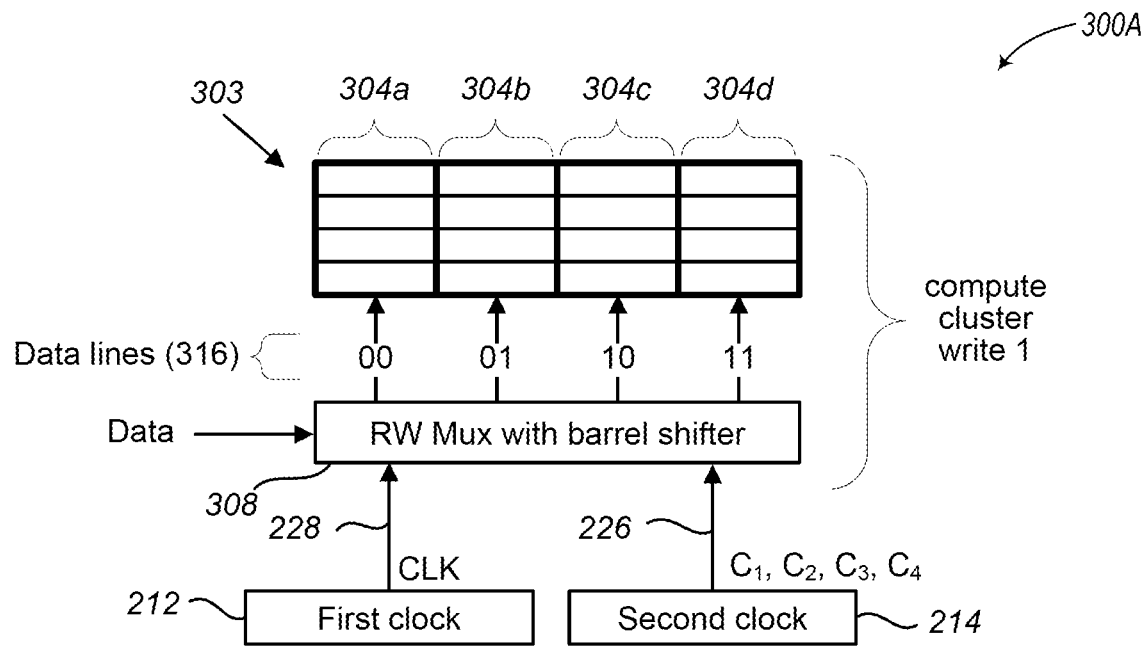
FIGS. 3A-3D illustrate use-case context diagrams of the use of a self-shifting multiplexer for consecutive writes of a plurality of data to a memory array.

FIG. 3A illustrates an example 300A for a first compute cluster write. Incoming data is written to columns 304a, 304b, 304c, and 304d, in that order, via data lines addressed as 00, 01, 10, and 11, respectively. The first data of the first compute cluster is stored in column 304a, the second data of the first compute cluster is stored in column 304b, the third data of the first compute cluster is stored in column 304c, and the fourth data of the first compute cluster is stored in column 304d. The data in the memory is then processed, such as described above in conjunction with FIGS. 2A-2C.

Figure 3B:
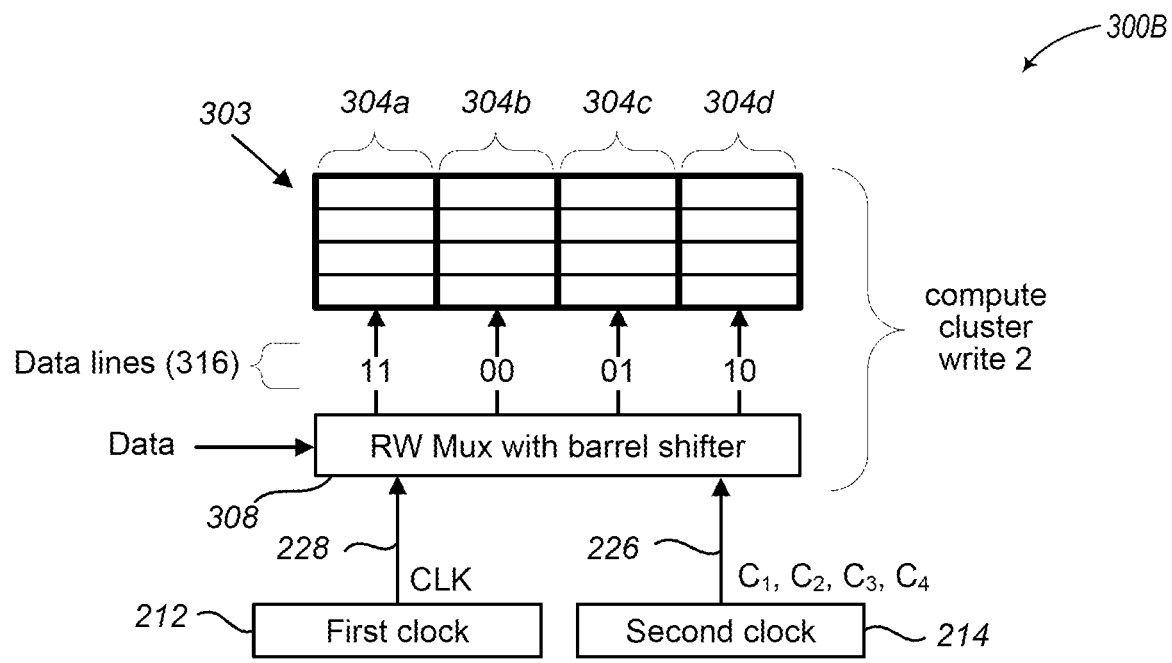

FIG. 3B illustrates an example 300B for a second compute cluster write that is subsequent to the first compute cluster write in FIG. 3A. When data for the second compute cluster write is received, the barrel shifter modifies the address of the data lines such that data lines addressed as 00, 01, 10, and 11 correspond to columns 304b, 304c, 304d, and 304a, respectively. The incoming data is written to columns 304b, 304c, 304d, and 304a, in that order, via data lines addressed as 00, 01, 10, and 11, respectively. The first data of the second compute cluster is stored in column 304b, the second data of the second compute cluster is stored in column 304c, the third data of the second compute cluster is stored in column 304d, and the fourth data of the second compute cluster is stored in column 304a. The data in the memory is then processed, such as described above in conjunction with FIGS. 2A-2C.

Figure 3C:
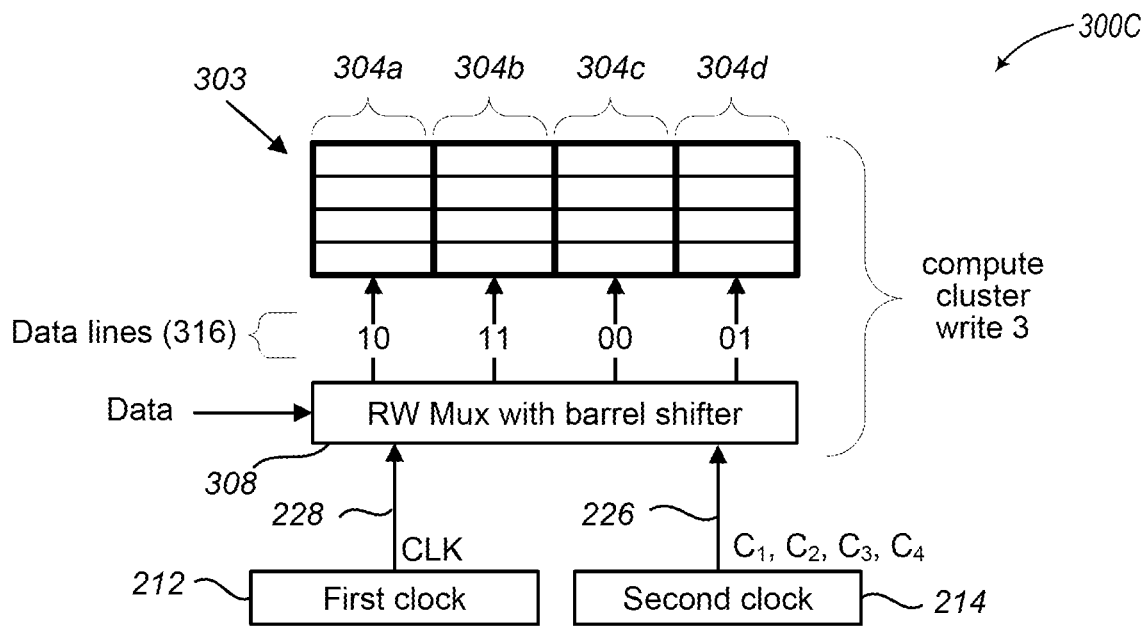

FIG. 3C illustrates an example 300C for a third compute cluster write that is subsequent to the second compute cluster write in FIG. 3B. When data for the third compute cluster write is received, the barrel shifter again modifies the address of the data lines such that data lines addressed as 00, 01, 10, and 11 correspond to columns 304c, 304d, 304a, and 304b, respectively. The incoming data is written to columns 304c, 304d, 304a, and 304b, in that order, via data lines addressed as 00, 01, 10, and 11, respectively. The first data of the third compute cluster is stored in column 304c, the second data of the third compute cluster is stored in column 304d, the third data of the third compute cluster is stored in column 304a, and the fourth data of the third compute cluster is stored in column 304b. The data in the memory is then processed, such as described above in conjunction with FIGS. 2A-2C.

Figure 3D:
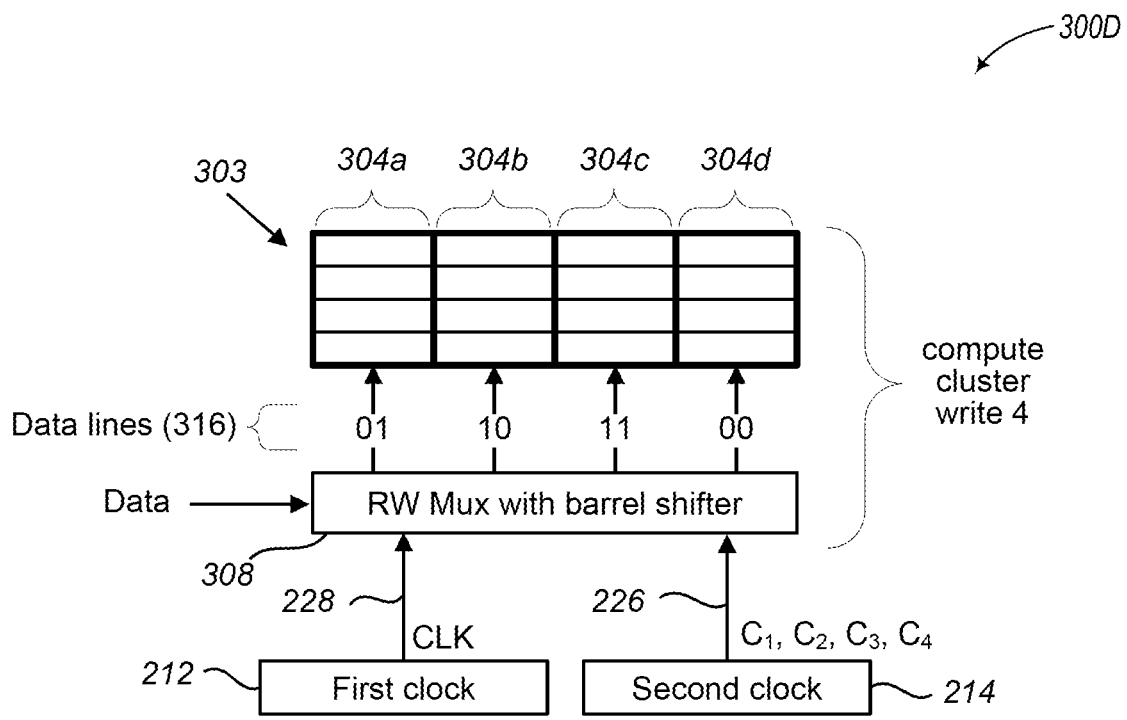

FIG. 3D illustrates an example 300D for a fourth compute cluster write that is subsequent to the third compute cluster write in FIG. 3C. When data for the fourth compute cluster write is received, the barrel shifter again modifies the address of the data lines such that data lines addressed as 00, 01, 10, and 11 correspond to columns 304d, 304a, 304b, and 304c, respectively. The incoming data is written to columns 304d, 304a, 304b, and 304c, in that order, via data lines addressed as 00, 01, 10, and 11, respectively. The first data of the fourth compute cluster is stored in column 304d, the second data of the fourth compute cluster is stored in column 304a, the third data of the fourth compute cluster is stored in column 304b, and the fourth data of the fourth compute cluster is stored in column 304c. The data in the memory is then processed, such as described above in conjunction with FIGS. 2A-2C.

When data for a fifth compute cluster write is received, the barrel shifter again modifies the address of the data lines such that data lines addressed as 00, 01, 10, and 11 correspond to columns 304a, 304b, 304c, and 304d, respectively, as illustrated in FIG. 3A. The shifting of data line addresses, as illustrated in FIGS. 3A-3D, can continue in this manner for consecutive compute cluster writes. This shifting facilitates semi-random storage of continuous errors, which facilitates removal of such errors through the learning/inference process or ignored in the analysis of target images.

As described above, a first clock signal may be utilized to initiate a multiplexer to cycle through its data lines for a read operation of a compute-cluster cycle for configurable number of data lines. FIGS. 3A-3D also illustrate the use of such clock signals, but for data write operations.

In some embodiments, the signals received via the first clock input 228 from first clock 212 initialize the multiplexer 308 to cycle through the data lines 216, but each individual data line cycle is triggered by signals received from a second clock 214 via a second clock input 226. In this way, each separate compute-cluster cycle is triggered by a clock signal from the first clock 212.

In FIG. 3A, for example, when multiplexer 308 receives clock signal CLK from first clock 212 to initiate a compute-cluster write cycle, multiplexer 308 cycles to the data line 216 address 00 in response to $C_1$ from second clock 214 so that data can be written to column 304a. Clock signal $C_2$ causes multiplexer 308 to cycle to the data line 316 address 01 so that data can be written to column 304b. Multiplexer 308 continues to operate in a similar manner for clock signals $C_3$ and $C_4$ to write data to columns 304c and 304d respectively.

FIG. 3B is similar, but when multiplexer 308 receives clock signal CLK from first clock 212 to initiate a compute-cluster write cycle and subsequently receives $C_1$ from second clock 214, multiplexer 308 cycles to the data line 316 address 00 so that data can be written to column 304b (not column 304a as in FIG. 3A). Clock signals $C_2$, $C_3$, and $C_4$ received from second clock 214, cause multiplexer 308 to cycle to the data line 316 addresses 01, 10, and 11, respectively, so that data can be written to columns 304c, 304d, and 304a, respectively.

Likewise, in FIG. 3C, a compute-cluster write cycle is initiated when multiplexer 308 receives clock signal CLK from first clock 212. Multiplexer 308 cycles to the data line 316 address 00 when $C_1$ is received from second clock 214 so that data can be written to column 304c (not column 304b as in FIG. 3B). Clock signals $C_2$, $C_3$, and $C_4$ received from second clock 214, cause multiplexer 308 to cycle to the data line 316 addresses 01, 10, and 11, respectively, so that data can be written to columns 304d, 304a, and 304b, respectively.

Moreover, in FIG. 3D, when multiplexer 308 receives clock signal CLK from first clock 212, multiplexer 208 initiates a compute-cluster write cycle and cycles to the data line 316 address 00 in response to receipt of $C_1$ from second clock 214 so that data can be written to column 304d (not column 304c as in FIG. 3C). Clock signals $C_2$, $C_3$, and $C_4$ received from second clock 214 cause multiplexer 308 to cycle to the data line 316 addresses 01, 10, and 11, respectively, so that data can be written to columns 304a, 304b, and 304c, respectively.

As illustrated, the multiplexer 308 utilizes one clock signal from first clock 212 and four clock signals from second clock 214 to write to the four data lines 216. Embodiments, however, are not so limited. Rather, in other embodiments, receipt of a clock signal from the first clock 212 may instruct the multiplexer 308 to cycle to a first data line 316 address 00. In this way, the first clock 212 is utilized to cycle to the first data line and the second clock 214 is utilized to cycle through each other corresponding data line for a given compute-cluster cycle write operation, which, in this illustrated example, the multiplexer 308 would utilize three clock signals from second clock 214 to write data to columns 304a-304d.

In other embodiments, each signal received via the first clock input 228 from first clock 212 triggers an individual data line cycle. For example, when multiplexer 308 receives a first clock signal from first clock 212, multiplexer 308 cycles to the data line address 00. But when multiplexer 308 receives a second clock signal from first clock 212, multiplexer 308 cycles to the data line address 01. Multiplexer 308 continues to operate in a similar manner for additional clock signals received from first clock 212. Once the maximum number of multiplexer cycles is reached for a compute-cluster cycle (e.g., four in the illustrated example in FIGS. 3A-3D), then the multiplexer 308 cycles back to the data line address 00 on the next clock signal. In such an embodiment, the second clock 214 is optional and is not utilized.

Although FIGS. 3A-3D illustrate the use of a multiplexer with a built-in barrel shifter to change the address of the data lines, embodiments are not so limited. Rather, in some embodiments, other shifting circuitry, such as circuitry external to the multiplexer may be utilized as pre-decoding for the multiplexer to shift and select the data lines for the multiplexer without changing the internal data lines addresses of the multiplexer.

FIGS. 4A-4D illustrate use-case context diagrams of the use of pre-decoding shifting for consecutive writes of a plurality of data to a memory array. The system includes a multiplexer 408, a memory array 402, and data-line-selection circuitry 406. The multiplexer 408 may be a write only or a read-write multiplexer. Unlike the example illustrated in FIGS. 3A-3D, where the address of the data lines changed, each data line 416 corresponds to a non-changing address. Therefore, data line address 00 corresponds to column 404a in the memory 402, data line address 01 corresponds to column 404b in the memory 402, data line address 10 corresponds to column 404c in the memory 402, and data line address 11 corresponds to column 404d in the memory 402.

Figure 4A:
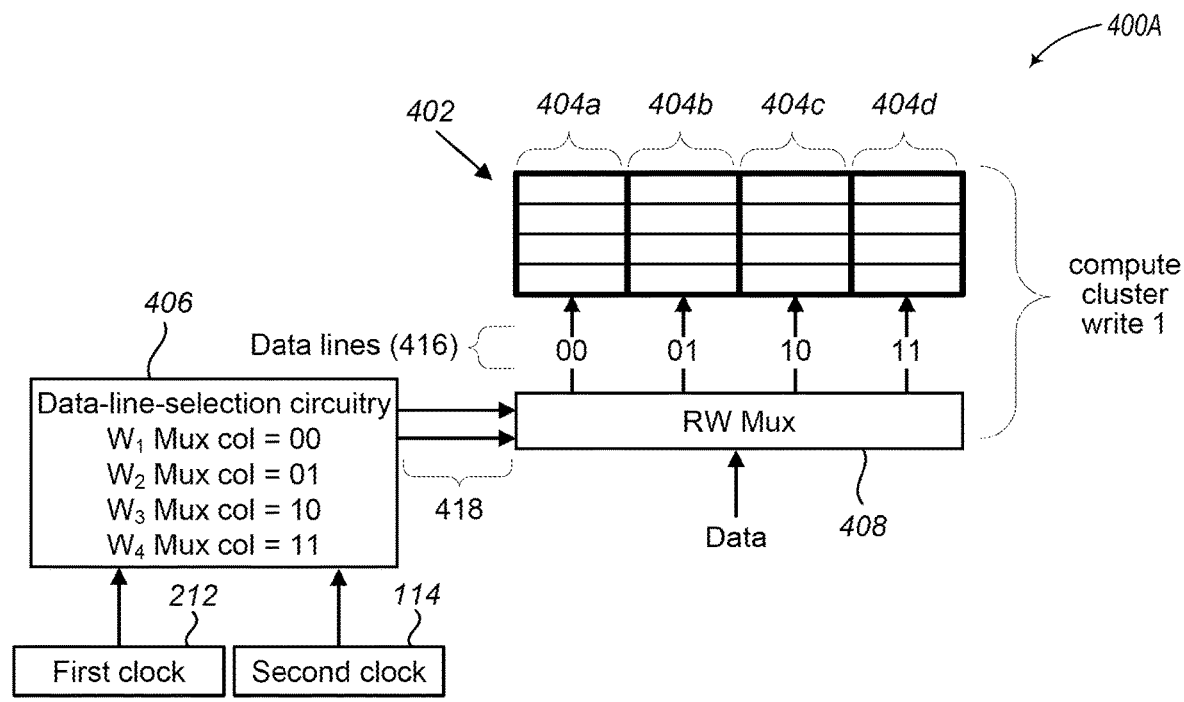
FIGS. 4A-4D illustrate use-case context diagrams of the use of pre-decoding shifting for consecutive writes of a plurality of data to a memory array.

FIG. 4A illustrates an example 400A for a first compute cluster write. The data-line-selection circuitry 406 selects the order in which the data lines 416 of the multiplexer 408 are cycled to write the data. In this example, the data-line-selection circuitry 406 selects the data line addresses as 00, 01, 10, and 11, in that order, and outputs the data line addresses to the multiplexer 408 via address-selection lines 318. The first data of the first compute cluster is stored in column 304a, the second data of the first compute cluster is stored in column 304b, the third data of the first compute cluster is stored in column 304c, and the fourth data of the first compute cluster is stored in column 304d. The data in the memory is then processed, such as described above in conjunction with FIGS. 2A-2C.

Figure 4B:
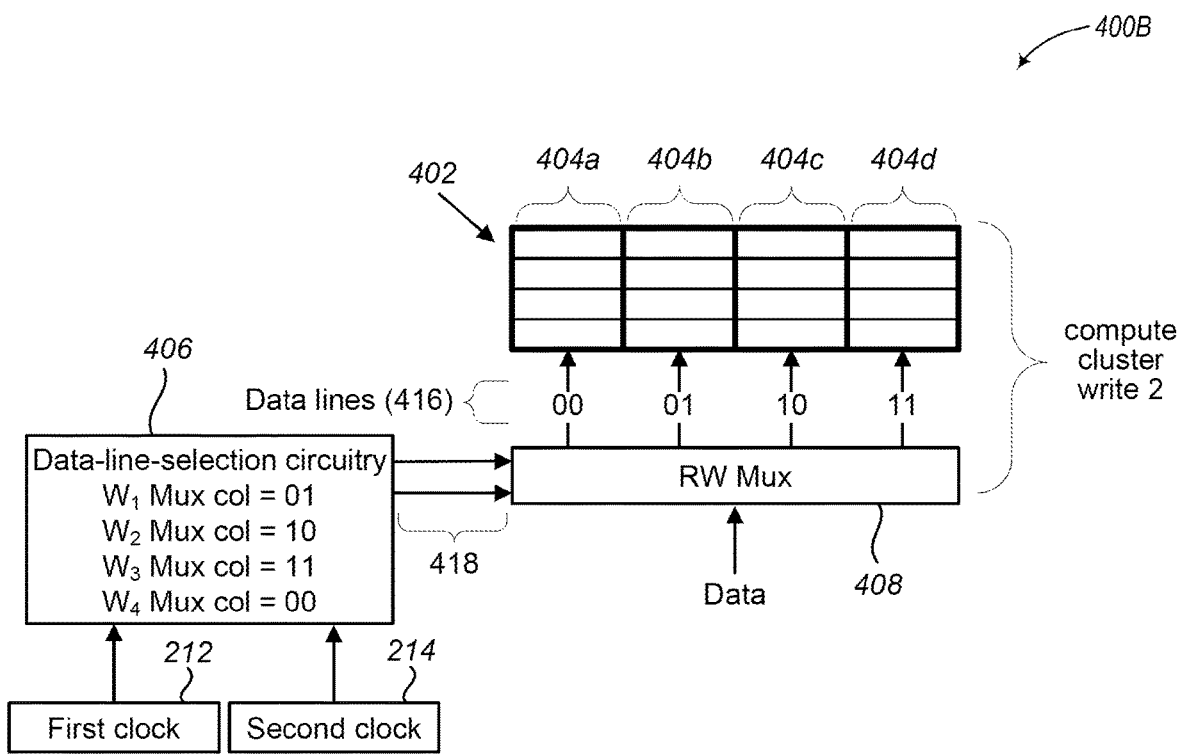

FIG. 4B illustrates an example 400B for a second compute cluster write that is subsequent to the first compute cluster write in FIG. 4A. When data for the second compute cluster write is received, the data-line-selection circuitry 406 modifies the order in which the data lines 416 of the multiplexer 408 are cycled to write the data. In this example, the data-line-selection circuitry 406 selects the data line addresses as 01, 10, 11, and 00, in that order, and outputs the data line addresses to the multiplexer 408 via address-selection lines 418. The first data of the second compute cluster is stored in column 304b, the second data of the second compute cluster is stored in column 304c, the third data of the second compute cluster is stored in column 304d, and the fourth data of the second compute cluster is stored in column 304a. The data in the memory is then processed, such as described above in conjunction with FIGS. 2A-2C.

Figure 4C:
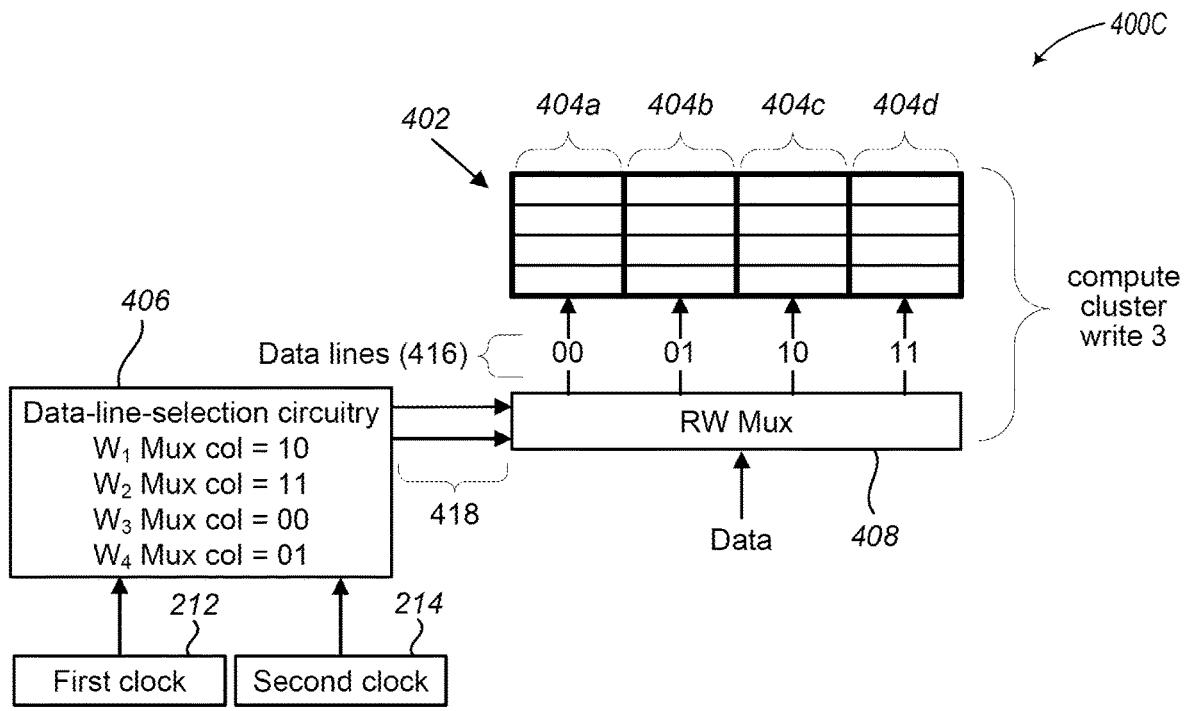

FIG. 4C illustrates an example 400C for a third compute cluster write that is subsequent to the second compute cluster write in FIG. 4B. When data for the second compute cluster write is received, the data-line-selection circuitry 406 modifies the order in which the data lines 416 of the multiplexer 408 are cycled to write the data. In this example, the data-line-selection circuitry 406 selects the data line addresses as 10, 11, 00, and 01, in that order, and outputs the data line addresses to the multiplexer 408 via address-selection lines 418. The first data of the third compute cluster is stored in column 304c, the second data of the third compute cluster is stored in column 304d, the third data of the third compute cluster is stored in column 304a, and the fourth data of the third compute cluster is stored in column 304b. The data in the memory is then processed, such as described above in conjunction with FIGS. 2A-2C.

Figure 4D:
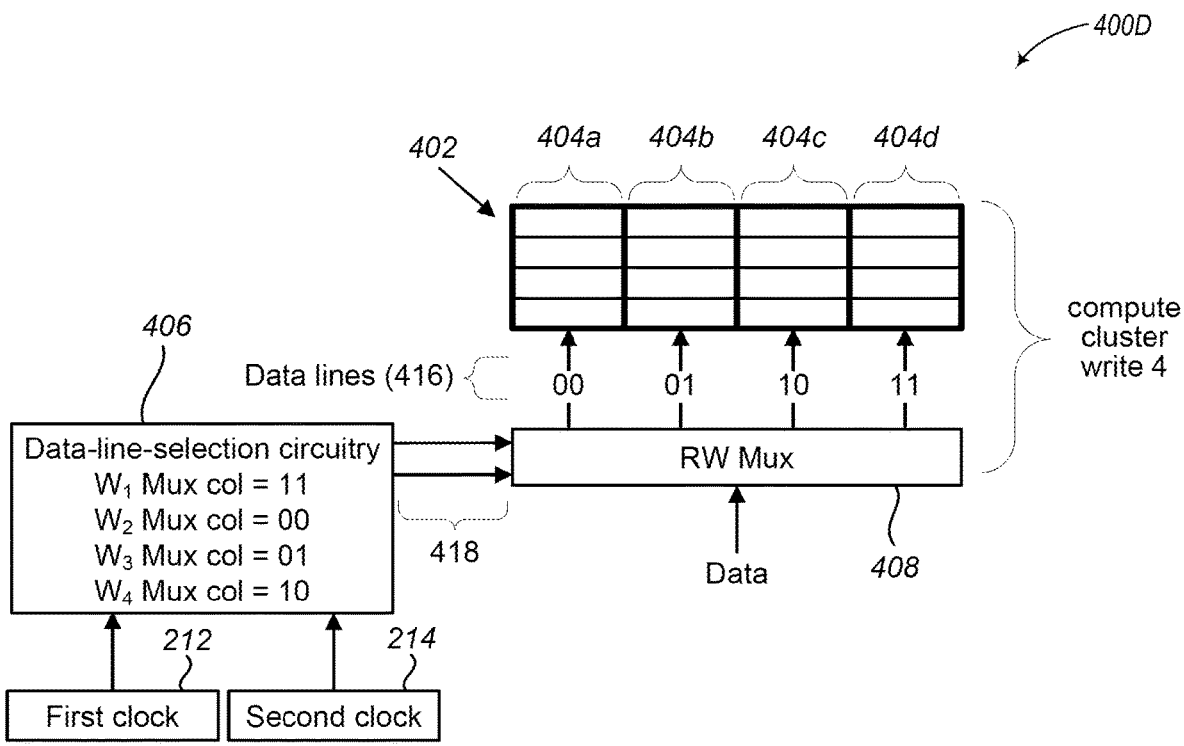

FIG. 4D illustrates an example 400D for a fourth compute cluster write that is subsequent to the third compute cluster write in FIG. 4C. When data for the second compute cluster write is received, the data-line-selection circuitry 406 modifies the order in which the data lines 416 of the multiplexer 408 are cycled to write the data. In this example, the data-line-selection circuitry 406 selects the data line addresses as 11, 00, 01, and 10, in that order, and outputs the data line addresses to the multiplexer 408 via address-selection lines 418. The first data of the fourth compute cluster is stored in column 304d, the second data of the fourth compute cluster is stored in column 304a, the third data of the fourth compute cluster is stored in column 304b, and the fourth data of the fourth compute cluster is stored in column 304c. The data in the memory is then processed, such as described above in conjunction with FIGS. 2A-2C.

When data for a fifth compute cluster write is received, the data-line-selection circuitry 406 modifies the order in which the data lines 416 to be data line addresses as 00, 01, 10, and 11, in that order, as illustrated in FIG. 4A. The shifting of data line addresses, as illustrated in FIGS. 4A-4D, can continue in this manner for consecutive compute cluster writes. Similar to what is discussed above in FIGS. 3A-3D, the shifting allows for semi-random storage of continuous errors, which allows the errors to be removed through the learning/inference process or ignored in the analysis of target images.

As described above in FIGS. 3A-3D, a first clock signal may be utilized to initiate a multiplexer to cycle through its data lines for a write operation of a compute-cluster cycle and a second clock for each individual cycle. The embodiments described in conjunction with FIGS. 4A-4D may also utilize a first clock and a second clock in a similar manor. In the illustrated examples in FIGS. 4A-4D, however, the data-line-selection circuitry 406 receives the clock signals from the first clock 212 and the second clock 214, rather than the multiplexer 408, itself. Instead, changes on address-selection lines 318 are triggered by the clock signals and trigger the multiplexer to select the appropriate data line 416. In other embodiments, the multiplexer 408 may include inputs (not illustrated) to receive the first clock signals and the second clock signals, similar to what is illustrated in FIGS. 3A-3D.

The data-line-selection circuitry 406 receives signals from first clock 212 to initialize the selection of the data line addresses, but each individual data line address cycle is triggered by signals received from a second clock 214. In this way, each separate compute-cluster cycle is triggered by a clock signal from the first clock 212.

Similar to what is described above, in some embodiments, the data-line-selection circuitry 406 utilizes one clock signal from first clock 212 and four clock signals from second clock 214 to select four data line addresses for the multiplexer 408 to write to the four different columns 404a-404d. In other embodiments, receipt of a clock signal from the first clock 212 may instruct the data-line-selection circuitry 406 to cycle to a first data line address and utilize the second clock 214 to cycle through each remaining corresponding data line address for a given compute-cluster cycle write operation, which, in this illustrated example, the data-line-selection circuitry 406 would utilize one clock signal from first clock 212 and three clock signals from second clock 214 to select four data line addresses for the multiplexer to write data to columns 304a-304d. In yet other embodiments, each signal received via the first clock input 228 from first clock 212 triggers an individual data line address selection.

In various embodiments, the input sequence to the barrel shifter and data-line-selection circuitry described above in conjunction with FIGS. 3A-3D and 4A-4D, respectively, can also change the sequence of address/data line selection to a different sequence. Moreover, in some embodiments, not all address inputs/data line addresses may be shifted. For example, for large multiplexer ratios, only a sub-set of the address inputs/data line addresses may be shifted to dither data stored in the memory under consideration.

The operation of certain aspects of the disclosure will now be described with respect to FIGS. 5-8. In at least one of various embodiments, processes 500, 600, 700, and 800 described in conjunction with FIGS. 5-8, respectively, may be implemented by one or more components or circuits associated with in-memory compute elements, as described herein.

Figure 5:
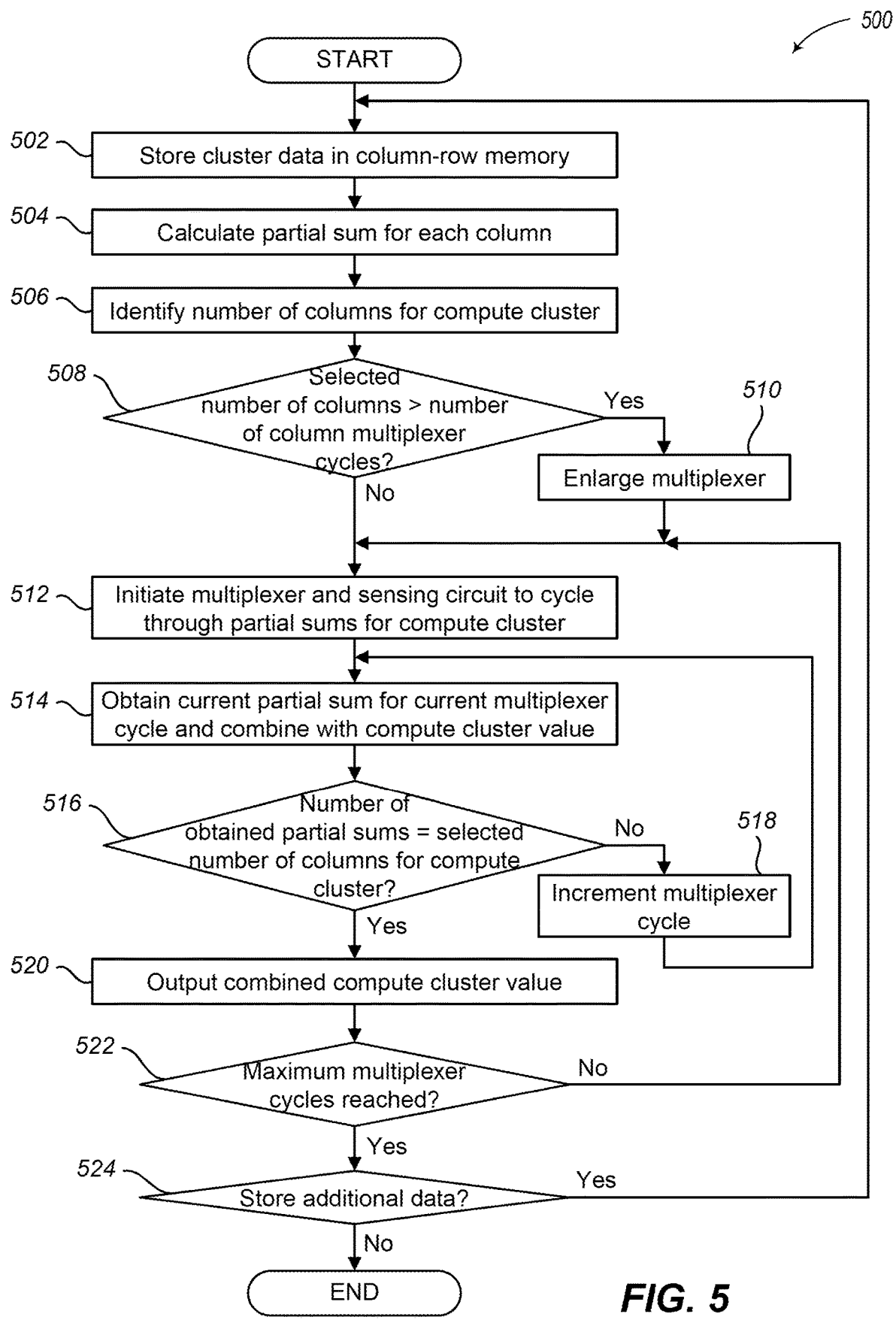
FIG. 5 illustrates a logical flow diagram generally showing one embodiment of a process for reading data from a memory array using a configurable multiplexer and sensing circuit as illustrated in FIGS. 2A-2C.

FIG. 5 illustrates a logical flow diagram generally showing one embodiment of a process 500 for reading data from a memory array using a configurable multiplexer and sensing circuit as illustrated in FIGS. 2A-2C. Process 500 begins, after a start block, at block 502, where cluster data is stored in a column-row memory array. Various embodiments of facilitating the storage of data in the memory are described in more detail below in conjunction with FIGS. 6 and 7.

Process 500 proceeds to block 504, where a partial sum is calculated for each column in the memory.

Process 500 continues at block 506, where a number of columns is selected for a compute cluster. In various embodiments, this is the number of columns in which data is stored for a single compute cluster, which may be referred to as the compute-cluster-cycle size.

Process 500 proceeds next to decision block 508, where a determination is made whether the selected number of columns for the compute cluster are greater than the number of column multiplexer cycles. In at least one embodiment, this determination is based on a comparison between the selected number of columns and the number of physical data lines on the multiplexer. If the selected number of columns for the compute cluster are greater than the number of multiplexer cycles, then process 500 flows to block 510; otherwise, process 500 flows to block 512.

At block 510, the multiplexer is enlarged. In some embodiments, the number of data lines supported by the multiplexer are reconfigured to accommodate the selected number of columns for the compute cluster. In at least one embodiment, enlargement of the multiplexer may include utilization of a second multiplexer as the enlarged portion of the multiplexer. This may be done, for example, by reconfiguring the first multiplexer to utilize circuitry for the second multiplexer to provide additional data lines or by configuring the first multiplexer to control the multiplexer as discussed with respect to FIG. 2C. Process 500 proceeds to block 512.

If, at decision block 508, the selected number of columns is equal to or less than the number of multiplexer cycles or after block 510, process 500 flows to block 512. At block 512, the multiplexer and a sensing circuit are initiated to cycle through the partial sums for each column in the memory associated with the compute cluster. As described above, a first clock signal may initiate the multiplexer to cycle through the partial sums for a compute-cluster cycle.

Process 500 proceeds to block 514, where the current partial sum for the current multiplexer cycle is obtained and combined with the compute cluster value.

Process 500 continues at decision block 516, where a determination is made whether the number of obtained partial sums equals the selected number of columns for the compute cluster. In various embodiments, this determination is made based on a comparison between the number of multiplexer cycles selected (the number of partial sums obtained) and the selected number of columns (the compute-cluster-cycle size). If the number of obtained partial sums equals the selected number of columns, then process 500 flows to block 520; otherwise process 500 flows to block 518.

At block 518, the multiplexer cycle in incremented to obtain the next partial sum for the compute cluster. After block 518, process 500 loops to block 514, to obtain the next partial sum for the incremented multiplexer cycle.

If, at decision block 516, the number of obtained partial sums equals the selected number of columns for the compute cluster, then process 500 flows from decision block 516 to block 520. At block 520, the combined compute cluster value is output to a buffer, which can be accesses by another component of the system for further processing, such as an input to a next layer of the neural network processing.

Process 500 continues at decision block 522, where a determination is made whether the maximum number of multiplexer cycles is reached. In various embodiments, the maximum number of multiplexer cycles is the physical number of data lines associated with the multiplexer. If the maximum number of multiplexer cycles is reached, then process 500 flows to decision block 524; otherwise, process 500 loops to block 512 to initiate the multiplexer and sensing circuit to cycle through the next set of partial sums for the next compute cluster for the selected number of columns.

At decision block 524, a determination is made whether additional data is to be stored in the memory, such as for a next set of compute clusters. If additional data is to be stored in the memory, process 500 loops to block 502; otherwise, process 500 terminates or otherwise returns to a calling process to perform other actions.

Figure 6:
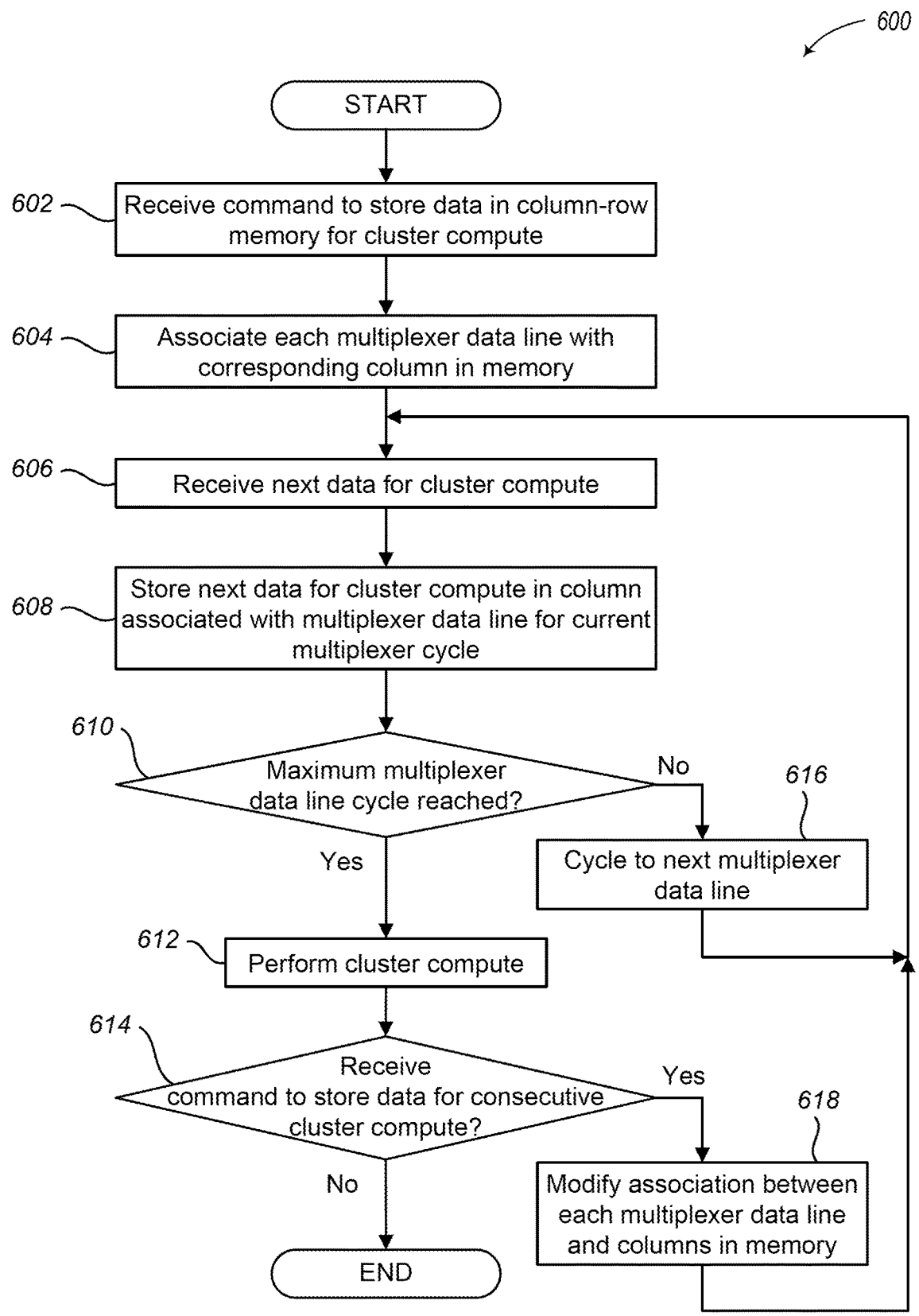
FIG. 6 illustrates a logical flow diagram generally showing one embodiment of a process for employing a multiplexer that modifies data line addresses for consecutive writes of a plurality of data to a memory array as illustrated in FIGS. 3A-3D.

FIG. 6 illustrates a logical flow diagram generally showing one embodiment of a process 600 for employing a multiplexer that modifies data line addresses for consecutive writes of a plurality of data to a memory array as illustrated in FIGS. 3A-3D.

Process 600 begins, after a start block, at block 602, where a command is received to store data in a column-row memory array for cluster compute operations. This command may be a write command or may be data on a particular input data line.

Process 600 proceeds to block 604, where each multiplexer data line is associated with a corresponding column in the memory. In various embodiments, the association between a column in the memory and a particular data line of the multiplexer includes selecting and assigning a multiplexer address to that particular data line. In one example embodiment, a first data line of the multiplexer is assigned address 00, a second data line of the multiplexer is assigned address 01, a third data line of the multiplexer is assigned address 10, and a fourth data line of the multiplexer is assigned address 11.

Process 600 continues at block 606, where the next data for the cluster compute operation is received. In various embodiments, the next data is the incoming data that is to be stored in the memory for a particular compute cluster.

Process 600 proceeds next to block 608, where the next data for the cluster compute is stored in the column associated with the multiplexer data line for the current multiplexer cycle. In various embodiments, the current multiplexer cycle is the current address of a data line of the multiplexer. For example, when first data is received, the current multiplexer cycle is the first cycle, and may use address 00; when second data is received, the current multiplexer cycle is the second cycle, and may use address 01; and so on.

Process 600 continues next at decision block 610, where a determination is made whether the maximum data line cycle of the multiplexer has been reached. In some embodiments, the maximum data line cycle is the number of physical data lines of the multiplexer. In other embodiments, the maximum data line cycle may be a selected number of data line or columns for a particular compute cluster. If the last or maximum data line cycle of the multiplexer has been reached, then process 600 flows to block 612; otherwise, process 600 flows to block 616.

At block 616, the multiplexer cycles to the next data line. In at least one embodiment, the multiplexer increments its current multiplexer cycle data line address to a next address. For example, if the data was stored via address 00 at block 608, then the next multiplexer data line address may be 01. Process 600 then loops to block 606 to receive the next data to be stored in the memory for the cluster compute operation.

If, at decision block 610, the maximum multiplexer data line cycle has been reached, then process 600 flows from decision block 610 to block 612. At block 612, the cluster compute operation is performed. In some embodiments, a read command may be received, which initiates the reading of the memory columns via the multiplexer and a sensing circuit, such as described herein, including FIGS. 2A-2C and process 500 in FIG. 5.

Process 600 proceeds next to decision block 614, where a determination is made whether a command is received to store data for a consecutive cluster compute operation. If a consecutive cluster compute operation is to be performed, process 600 flows to block 618; otherwise, process 600 terminates or otherwise returns to a calling process to perform other actions.

At block 618, the association between each multiplexer data line and the columns in memory are modified. In at least one non-limiting embodiment, the multiplexer includes a barrel shifter that modifies the data line/column association between storing data for consecutive cluster compute operations. For example, the barrel shifter modifies the address of the data lines, as illustrated in FIGS. 3A-3D. If the previous association indicated that the first data line of the multiplexer is assigned address 00, the second data line of the multiplexer is assigned address 01, the third data line of the multiplexer is assigned address 10, and the fourth data line of the multiplexer is assigned address 11, then the modified association may be the first data line of the multiplexer is assigned address 01, the second data line of the multiplexer is assigned address 10, the third data line of the multiplexer is assigned address 11, and the fourth data line of the multiplexer is assigned address 00.

After block 618, process 600 loops to block 606 to receive data for the next cluster computer operation.

Figure 7:
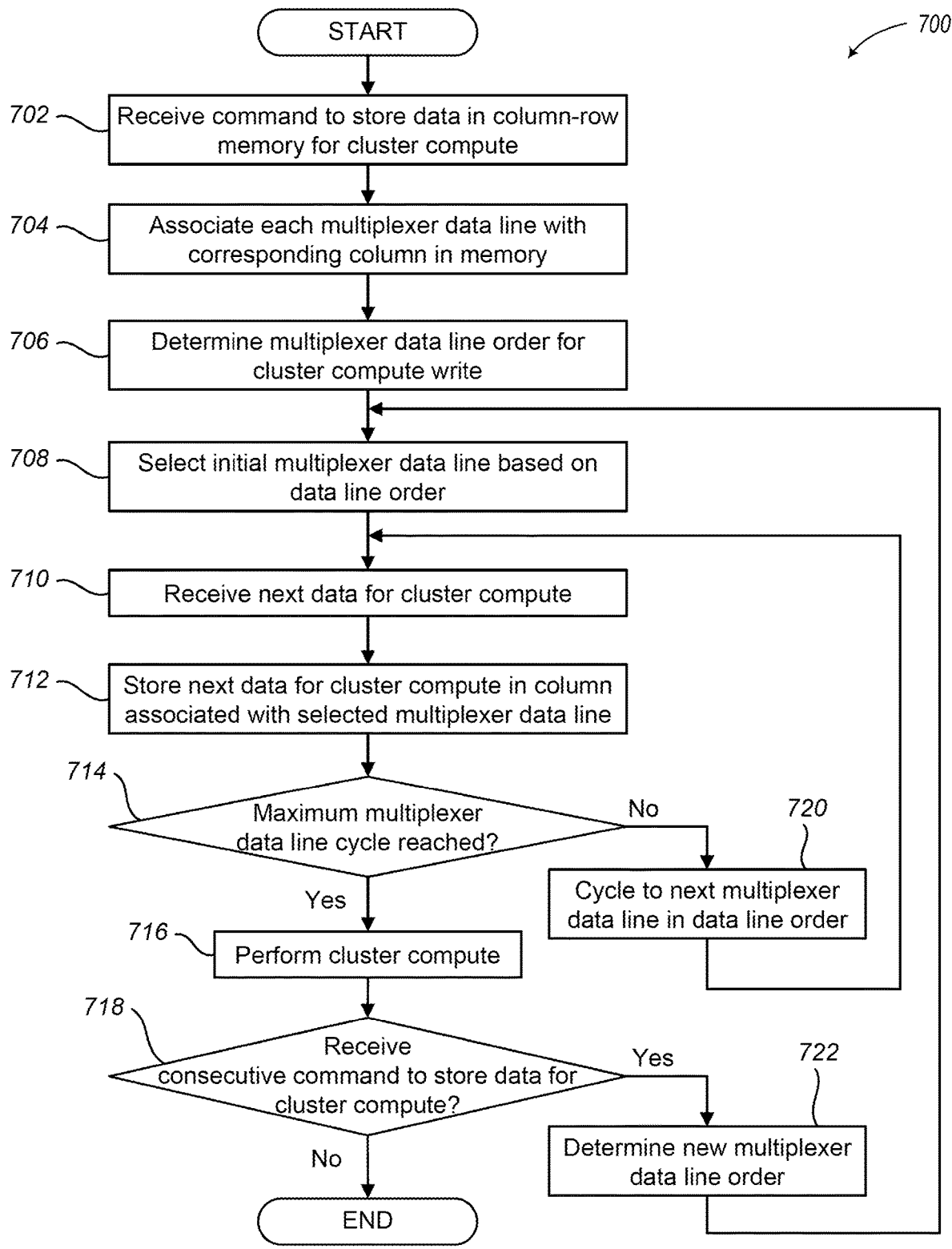
FIG. 7 illustrates a logical flow diagram generally showing one embodiment of a process for employing pre-decoding shifting for consecutive writes of a plurality of data to a memory array as illustrated in FIGS. 4A-4D.

FIG. 7 illustrates a logical flow diagram generally showing one embodiment of a process 700 for employing pre-decoding shifting for consecutive writes of a plurality of data to a memory array as illustrated in FIGS. 4A-4D.

Process 700 begins, after a start block, at block 702, where a command is received to store data in a column-row memory array for cluster compute operations. In various embodiments, block 702 may employ embodiments described above in conjunction with block 602 in FIG. 6.

Process 700 proceeds to block 704, where each multiplexer data line is associated with a corresponding column in the memory. In various embodiments, block 704 may employ embodiments described above in conjunction with block 604 in FIG. 6.

Process 700 continues at block 706, where an order is determined for the multiplexer data lines to write data for the cluster compute operation. In some embodiments, the initial order of the multiplexer data lines maybe preselected or predetermined. In other embodiments, the initial data line order may be random.

In at least one embodiment, the multiplexer data line order is the order in which the data line addresses are provided to the multiplexer for data writes. For example, selection circuitry may determine that the initial order of the data line addresses is 00, 01, 10, 11. However, other orders may also be utilized. Likewise, other numbers of addresses may also be utilized depending on the size of the multiplexer.

Process 700 proceeds next to block 708, where an initial multiplexer data line is selected based on the determined data line order. In at least one embodiment, selection of the initial multiplexer data line is the first data line address in the determined data line order and output to the multiplexer.

Process 700 continues at block 710, where the next data for the cluster compute operation is received. In various embodiments, block 710 may employ embodiments described above in conjunction with block 606 in FIG. 6.

Process 700 proceeds next to block 712, where the next data for the cluster compute is stored in the column associated with the selected multiplexer data line. In at least one embodiment, the data line associated with the data line address for the selected data line is utilized to store the received data in the corresponding column in the memory.

Process 700 continues next at decision block 714, where a determination is made whether the maximum data line cycle of the multiplexer has been reached. In various embodiments, decision block 714 may employ embodiments of decision block 610 in FIG. 6. If the last or maximum data line cycle of the multiplexer has been reached, then process 700 flows to block 716; otherwise, process 700 flows to block 720.

At block 720, the multiplexer is instructed to cycle to the next data line based on the determined data line order. In at least one embodiment, the selection circuitry increments to the data line address in the determined data line order. For example, if the previous data line address is 00 and the data line order are addresses 00, 01, 10, 11, then the next data line address is 01. Process 700 then loops to block 710 to receive the next data to be stored in the memory for the cluster compute operation.

If, at decision block 714, the maximum multiplexer data line cycle has been reached, then process 700 flows from decision block 714 to block 716. At block 716, the cluster compute operation is performed. In various embodiments, block 716 may employ embodiments described above in conjunction with block 612 in FIG. 6.

Process 700 proceeds next to decision block 718, where a determination is made whether a command is received to store data for a consecutive cluster compute operation. In various embodiments, decision block 718 may employ embodiments described above in conjunction with decision block 614 in FIG. 6. If a consecutive cluster compute operation is to be performed, process 700 flows to block 722; otherwise, process 700 terminates or otherwise returns to a calling process to perform other actions.

At block 722, a new multiplexer data line order is determined. The new multiplexer data line order may be random or the new multiplexer data line order may increment the previous addresses. For example, if the previous order is addresses 00, 01, 10, 11, then the new order may be addresses 01, 10, 11, 00. In at least one non-limiting embodiment, the data-line-selection circuitry includes circuitry (e.g., a barrel shifter) that selects the data line order for storing data for consecutive cluster compute operations. For example, the data-line-selection circuitry selects different orders in which to instruct the multiplexer to cycle through its data lines for consecutive cluster compute operations, as illustrated in FIGS. 4A-4D.

After block 722, process 700 loops to block 708 to receive data for the next cluster computer operation.

Figure 8:
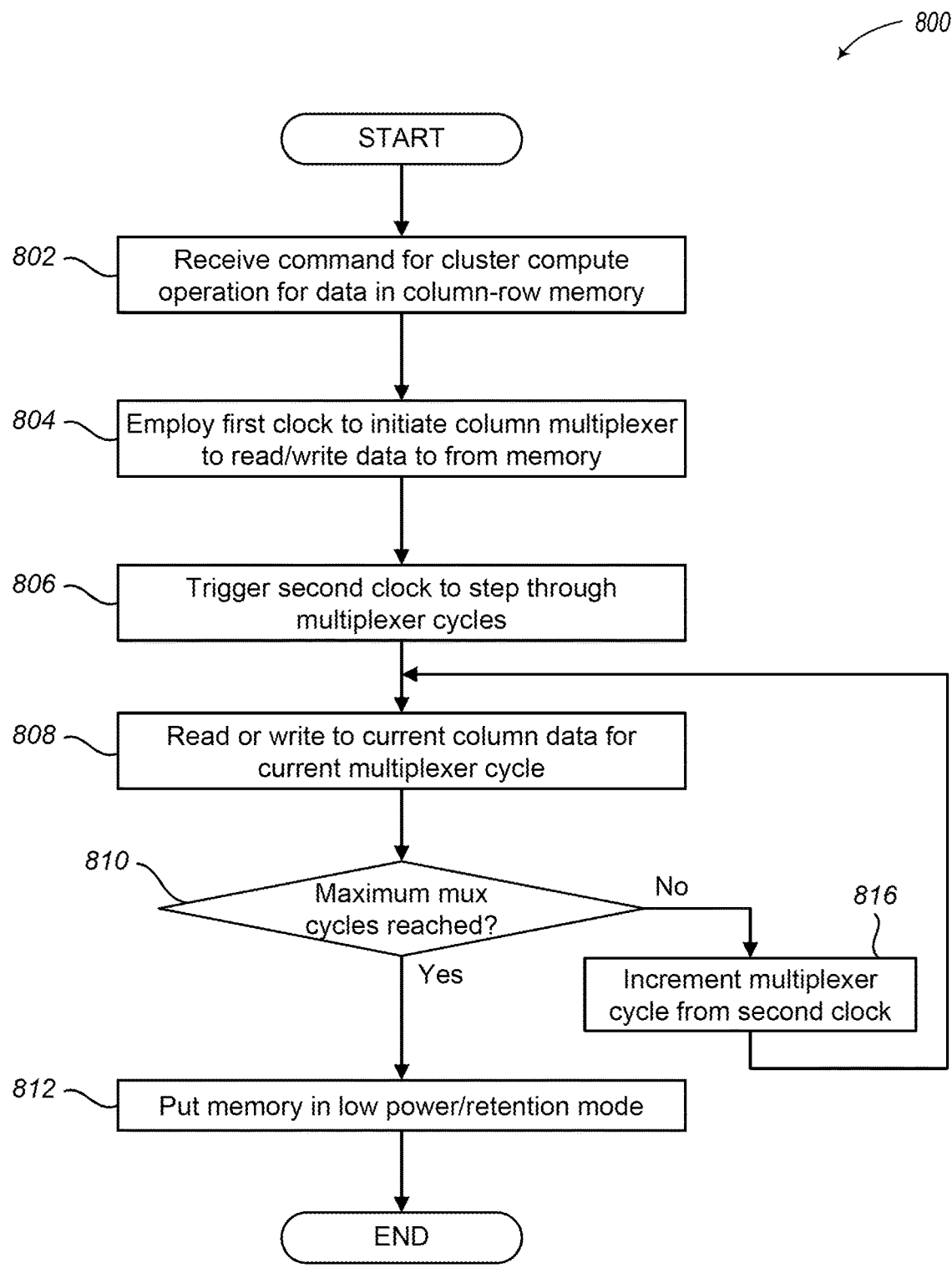
FIG. 8 illustrates a logical flow diagram generally showing one embodiment of a process for utilizing a first clock to initiate multiplexer reads and writes to a memory array and utilizing a second clock to initiate each cycle of the multiplexer read and write.

FIG. 8 illustrates a logical flow diagram generally showing one embodiment of a process for utilizing a first clock (e.g., an external system clock) to initiate multiplexer reads and writes to a memory array and utilizing a second clock (e.g., an internal memory clock) to initiate each cycle of the multiplexer read and write.

Process 800 begins, after a start block, at block 802, where a command is received for cluster compute operation for data in a column-row memory. In some embodiments, the command may be a read command, such as to read data from the memory (e.g., as described above in conjunction with FIGS. 2A-2C). In other embodiments, the command may be a write command, such as to write data to the memory (e.g., as described above in conjunction with FIGS. 3A-3D and 4A-4D).

Process 800 proceeds to block 804, where a first clock signal is utilized to initiate a column multiplexer to facilitate a read or write operation to the memory. In various embodiments, the first clock is separate from the memory itself. In at least one embodiment, the first clock may be separate from the memory unit or chip and may be an overall system clock.

Process 800 continues at block 806, where a second clock is trigged to step through the multiplexer cycles. In at least one embodiment, the first clock signal may trigger the first multiplexer cycle. In other embodiments, the first multiplexer cycle is triggered with the first second clock signal after the first clock signal.

Process 800 proceeds next to block 808, where data is read from or written to the memory at the column that corresponds to the current multiplexer cycle. In various embodiments, block 808 may employ embodiments of block 514 in FIG. 5, block 608 in FIG. 6, or block 712 in FIG. 7, depending on the operation and utilization of the multiplexer and memory.

Process 800 continues next to decision block 810, where a determination is made whether the maximum number of multiplexer cycles is reached. In various embodiments, decision block 810 may employ embodiments of decision block 522 in FIG. 5, decision block 610 in FIG. 6, or decision block 714 in FIG. 7. If the maximum multiplexer cycle is reached, process 800 flows to block 812; otherwise, process 800 flows to block 716.

At block 716, the multiplexer is incremented to the next multiplexer cycle at the next second clock signal. In various embodiments, the current memory cycle address is incremented in response to receipt of a next second clock signal. After block 716, process 800 loops to block 808 to read or write data to the next column in the memory associated with the next multiplexer cycle.

If, at decision block 810, the maximum multiplexer cycle is reached, process 800 flows from decision block 810 to block 812. At block 812, the memory is put into a low power mode or memory retention mode. In some embodiments, the memory may transition through other states between the operating mode and the memory retention mode or between the low power mode and the retention mode. Such other states may include, but are not limited to, an idle state, a wait state, a light sleep state, etc. In other embodiments, block 812 may be optional and the memory may not be moved into the retention or a low power mode after the maximum multiplexer cycle is reached at decision block 810.

Embodiments of the foregoing processes and methods may contain additional acts not shown in FIGS. 5-8, may not contain all of the acts shown in FIGS. 5-8, may perform acts shown in FIGS. 5-8 in various orders, may combine acts, and may be modified in various respects. For example, process 800 in FIG. 8 may omit act 812 when continuous compute clusters are being written to and read from the memory for consecutive neural network layer processing, combine acts 804 and 806, etc.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

Embodiments may be further or alternatively summarized as described below.

A system may be summarized as including a memory array having a plurality of cells arranged as a plurality of rows of cells intersecting a plurality of columns of cells; a column multiplexer having a plurality of data lines where each respective data line corresponds to a respective column of the plurality of columns, and having a plurality of selection lines that indicate which of the plurality of data lines is selected for a given cycle, wherein the column multiplexer, in operation, cycles through the plurality of data lines to write data to the plurality of cells based on a data line address received via the plurality of selection lines; and data-line-selection circuitry, which, in operation, selects a first cycle order for a first write operation to write a first plurality of data to the plurality of cells and selects a second cycle order for a second write operation to write a second plurality of data to the plurality of cells, wherein the first and second cycle orders indicate an order in which the plurality of data lines are selected on each cycle, and wherein the first cycle order is different from the second cycle order.

The column multiplexer may include the data-line-selection circuitry to select the plurality of data lines in the first cycle order during the first write operation and select the plurality of data lines in the second cycle order during the second write operation. The data-line-selection circuitry may include a plurality of output lines that correspond to the plurality of selection lines of the column multiplexer and the data-line-selection circuitry, in operation, outputs the data line address of the plurality of data lines via the plurality of output lines in accordance with the first selected cycle order to write of a first plurality of data to the plurality of cells during the first write operation and to output the data line address of the plurality of data lines via the plurality of output lines in accordance with the second selected cycle order to write a second plurality of data to the plurality of cells during the second write operation.

The system may include cluster cycle management circuitry, which, in operation, generates a plurality of control signals in response to a clock signal and provides the plurality of control signals to the column multiplexer to cycle through the plurality of data lines to write data to a respective column in the plurality of columns of cells.

The system may include a plurality of computation circuits where each computation circuit calculates a computation value from cell values in a corresponding column of cells in the plurality of cells and corresponds to a respective data line of the plurality of data lines of the column multiplexer; and a sensing circuit, which, in operation, obtains the computation values from the plurality of computation circuits via the column multiplexer as the column multiplexer cycles through the plurality of data lines and to combine the obtained computation values over a determined number of multiplexer cycles during a read operation. The determined number of multiplexer cycles may be less than the plurality of data lines of the column multiplexer. The sensing circuit, in operation, may calculate a first value from the obtained computation values via a first set of the plurality of data lines during a first set of cycles of the column multiplexer during a first portion of the read operation and to calculate a second value from the obtained computation values via a second set of the plurality of data lines during a second set of cycles of the column multiplexer during a second portion of the read operation, wherein the first and second sets of cycles include the determined number of multiplexer cycles. The column multiplexer, in operation, may cycle through a second plurality of data lines that each corresponds to a respective second computation circuit of a plurality of second computation circuits, where each second computation circuit calculates a computation value from cell values in a corresponding column of cells in a second plurality of cells. The second plurality of data lines for the column multiplexer may be provided by a second column multiplexer. The system may include a first clock, which, in operation, initiates the read operation of the column multiplexer to cycle through the plurality of data lines for the determined number of multiplexer cycles; and a second clock, which, in operation, initiates each cycle for each data line of the column multiplexer for the determined number of multiplexer cycles during the read operation for the sensing circuit to obtain the computation value from the corresponding computation circuits.

A method may be summarized as including receiving a first command to store first data for a first cluster compute operation in a plurality of cells that are arranged as a plurality of rows of cells intersecting a plurality of columns of cells; associating each of a plurality of multiplexer data lines with a respective column of the plurality of columns; determining a first data-line order for storing the first data in the plurality of cells; cycling through the plurality of data lines in accordance with the first data-line order to store the first data in the respective columns of the plurality of columns for the first cluster compute operation; performing the first cluster compute operation; in response to completion of the first cluster compute operation, receiving a second command to store second data for a second cluster compute operation in the plurality of cells; determining a second data-line order for storing the second data in the plurality of cells, the second data-line order being different from the first data-line order; and cycling through the plurality of data lines in accordance with the second data-line order to store the second data in the respective columns of the plurality of columns for the second cluster compute operation.

Determining the second data-line order for storing the second data in the plurality of cells may include employing a barrel shifter to modify an address of each of the plurality of data lines based on the first data-line order. Determining the first data-line order for storing the first data in the plurality of cells may include selecting the first data-line order and instructing a column multiplexer to cycle through the plurality of data lines in accordance with the first data-line order, and wherein determining the second data-line order for storing the second data in the plurality of cells may include selecting the second data-line order and instructing the column multiplexer to cycle through the plurality of data lines in accordance with the second data-line order.

Cycling through the plurality of data lines in accordance with the first data-line order may include initiating the cycling through the plurality of data line in accordance with the first data-line order in response to a first clock signal from a first clock; and initiating each cycle for each data line in the first data-line order to write data to each respective column of the plurality of columns in response to a first set of clock signals from a second clock; wherein cycling through the plurality of data lines in accordance with the second data-line order may include initiating the cycling through the plurality of data line in accordance with the second data-line order in response to a second clock signal from the first clock; and initiating each cycle for each data line in the first data-line order to write data to each respective column of the plurality of columns in response to a second set of clock signals from the second clock.

Performing the first cluster compute operation may include computing a plurality of compute values from cell values from the plurality of columns of cells, wherein each respective compute value is computed from cells values from a respective column of cells; selecting a number of multiplexer cycles for the first cluster compute operation based on a number of columns storing data for the first cluster compute operation; generating a result of the first cluster compute operation by employing a column multiplexer to cycle through a first subset of the plurality of compute values for the selected number of multiplexer cycles and by employing a sensing engine to combine the respective compute values from the first subset of compute values; and outputting the result of the first cluster compute operation. The method may further include generating a second result of the first cluster compute operation by employing a second column multiplexer to cycle through a second subset of the plurality of compute values for the selected number of multiplexer cycles and by employing a second sensing engine to combine the respective compute values from the second subset of compute values; and outputting the second result of the first cluster compute operation. The selected number of multiplexer cycles may be less than the plurality of data lines.

A computing device may be summarized as including means for receiving a plurality of data to store in a plurality of cells that are arranged as a plurality of rows of cells intersecting a plurality of columns of cells; means for determining a data-line order for storing the received plurality of data in the plurality of cells; means for cycling through the plurality of data lines in accordance with the data-line order to store the received plurality of data in respective columns of the plurality of columns; and means for modifying the data-line order for storing subsequently received plurality of data in the plurality of cells.

The computing device may further include means for initiating the cycling through the plurality of data lines based on signals from a first clock; and means for initiating each cycle for each data line of the plurality of data lines in accordance with the data-line order based on signals from a second clock. The computing device may further include means for computing respective computation values from cell values from each respective column of the plurality of columns of cells; means for cycling through each respective computation value for a determined number of computation values; and means for combining the respective computation values from a subset of computation values to generate a result of a data compute cluster for the determined number of computation values.

A system may be summarized as including a memory array having a plurality of cells arranged as a plurality of rows of cells intersecting a plurality of columns of cells; a column multiplexer having a plurality of data lines where each respective data line corresponds to a respective column of the plurality of columns, wherein the column multiplexer, in operation, initiates cycling through the plurality of data lines to read data from or write data to the plurality of cells in response to a clock signal from a first clock for a read or write operation, and wherein the column multiplexer, in operation, initiates each cycle for each data line of the column multiplexer to read from or write data to a respective column in the plurality of columns of cells in response to clock signals from a second clock that is separate from the first clock. The first clock may be a system clock external to the plurality of cells and the second clock may be a memory refresh clock associated with the plurality of cells.

The system may include data-line-selection circuitry, which, in operation, selects a first cycle order for a first write operation to write a first plurality of data to the plurality of cells and to select a second cycle order for a second write operation to write a second plurality of data to the plurality of cells, wherein the first and second cycle orders indicate an order in which the plurality of data lines are selected on each cycle, and wherein the first cycle order is different from the second cycle order. The data-line-selection circuitry may include a plurality of output lines that correspond to a plurality of selection lines of the column multiplexer and the data-line-selection circuitry, in operation, outputs a data line address of the plurality of data lines via the plurality of output lines in accordance with the first selected cycle order to write of a first plurality of data to the plurality of cells during the first write operation and to output the data line address of the plurality of data lines via the plurality of output lines in accordance with the second selected cycle order to write of a second plurality of data to the plurality of cells during the second write operation.

The column multiplexer, in operation, may modify an address of each of the plurality of data lines of the column multiplexer for writing consecutive pluralities of data to the plurality of cells. The column multiplexer, in operation, may select the plurality of data lines in a first cycle order during a first write operation and select the plurality of data lines in a second cycle order during a second write operation.

The system may include cluster cycle management circuitry, which, in operation, determines a number of multiplexer cycles based on a number of columns storing data of associated with a read operation; a plurality of computation circuits where each computation circuit calculates a computation value from cell values in a corresponding column of cells in the plurality of cells and corresponds to a respective data line of the plurality of data lines of the column multiplexer; and a sensing circuit, which, in operation, obtains the computation values from the plurality of computation circuits via the column multiplexer as the column multiplexer cycles through the plurality of data lines and to combine the obtained computation values over the determined number of multiplexer cycles during the read operation. The determined number of multiplexer cycles may be less than the plurality of data lines of the column multiplexer. The sensing circuit, in operation, may calculate a first value from the obtained computation values via a first set of the plurality of data lines during a first set of cycles of the column multiplexer during a first portion of the read operation and to calculate a second value from the obtained computation values via a second set of the plurality of data lines during a second set of cycles of the column multiplexer during a second portion of the read operation, wherein the first and second sets of cycles include the determined number of multiplexer cycles. The column multiplexer, in operation, may cycle through a second plurality of data lines that each corresponds to a respective second computation circuit of a plurality of second computation circuits, where each second computation circuit calculates a computation value from cell values in a corresponding column of cells in a second plurality of cells.

A method may be summarized as including receiving a command associated with a cluster compute operation to read data from or write data to a plurality of cells that are arranged as a plurality of rows of cells intersecting a plurality of columns of cells; initiating a multiplexer to cycle through a plurality of data lines in response to a clock signal from a first clock, each of the plurality of data lines corresponds to a respective column of the plurality of columns; and initiating each cycle of the multiplexer for each data line of the plurality of data lines to read data from or write data to each respective column of the plurality of columns in response to clock signals from a second clock. The first clock may be a system clock external to the plurality of cells and the second clock is a memory refresh clock associated with the plurality of cells.

The method may further include prior to initiating the multiplexer to cycle through the plurality of data lines, determining a data-line order for storing first data in the plurality of cells; and wherein initiating each cycle of the multiplexer for each data line of the plurality of data lines includes cycling through the plurality of data lines in accordance with the data-line order to store the data in the respective columns of the plurality of columns.

The method may further include receiving a second command to write second data to the plurality of cells; determining a second data-line order for storing first data in the plurality of cells; initiating the multiplexer to cycle through the plurality of data lines in response to a second clock signal from the first clock; and initiating each cycle of the multiplexer for each data line of the plurality of data lines to store the second data to each respective column of the plurality of columns in accordance with the second data-line order and in response to additional clock signals from the second clock. Determining the second data-line order for storing the second data in the plurality of cells may include employing a barrel shifter to modify an address of each of the plurality of data lines based on the first data-line order.

The method may further include computing a plurality of compute values from cell values from the plurality of columns of cells, wherein each respective compute value is computed from cells values from a respective column of cells; selecting a number of multiplexer cycles for a cluster compute read operation based on a number of columns storing data for the cluster compute read operation; and generating a result of the cluster compute read operation by employing the multiplexer to cycle through a first subset of the plurality of compute values for the selected number of multiplexer cycles and by employing a sensing engine to combine the respective compute values from the first subset of compute values.

The method may further include initiating a second multiplexer to cycle through a second plurality of data lines in response to the clock signal from the first clock, each of the second plurality of data lines corresponds to a respective column of a second plurality of columns in the plurality of cells; and initiating each cycle of the second multiplexer for each data line of the second plurality of data lines to read data from each respective column of the second plurality of columns in response to the clock signals from the second clock; and generating a second result of the cluster compute read operation by cycling through a second subset of the plurality of compute values for the selected number of multiplexer cycles and by employing a second sensing engine to combine the respective comp computation values from the second subset of compute values.

A computing device may be summarized as including means for receiving a command to read data from or write data to a plurality of cells that are arranged as a plurality of rows of cells intersecting a plurality of columns of cells; means for initiating a multiplexer to cycle through a plurality of data lines from a first clock source, each of the plurality of data lines corresponds to a respective column of the plurality of columns; and means for initiating each cycle of the multiplexer for each data line of the plurality of data lines to read data from or write data to each respective column of the plurality of columns from a second clock source.

The computing device may further include means for determining a data-line order for storing plurality of received data in the plurality of cells; means for cycling through the plurality of data lines in accordance with the data-line order to store the received plurality of data in respective columns of the plurality of columns; and means for modifying the data-line order for storing subsequently received plurality of data in the plurality of cells. The computing device may further include means for computing respective computation values from cell values from each respective column of the plurality of columns of cells; means for determining a number of computation values based on a number of columns storing data associated with a data compute cluster; means for cycling through each respective computation value for the determined number of computation values; and means for combining the respective computation values from a subset of computation values to generate a result of the data compute cluster for the determined number of computation values.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a memory array having a first plurality of cells arranged as a plurality of rows of cells intersecting a plurality of columns of cells;
a plurality of first computation circuits where each first computation circuit, in operation, calculates a computation value from cell values in a corresponding column of cells in the first plurality of cells;
a first column multiplexer, which, in operation, cycles through a plurality of data lines that each corresponds to a first computation circuit of the plurality of first computation circuits; and
control circuitry, which, in operation, responds to a cluster compute command by initiating, using a first clock signal, the first column multiplexer to cycle through a determined number of cycles, wherein the first column multiplexer cycles through the determined number of cycles using a second clock signal.

2. The device of claim 1, wherein the cluster compute command is a read command.

3. The device of claim 1, wherein the cluster compute command is a write command.

4. The device of claim 1, wherein the control circuitry, in operation, responds to completion of the determined number of cycles by generating control signals to place the memory array in a determined operational state.

5. The device of claim 4, wherein the determined operational state is one of a low-power state, a retention state, an idle state, a wait state, or a sleep state.

6. The device of claim 1, wherein the control circuitry, in operation, responds to completion of the determined number of cycles by generating control signals to transition the memory through a series of operational states.

7. The device of claim 1, wherein the first clock signal is a system clock signal and the second clock signal is a memory clock signal.

8. The device of claim 1, wherein the cluster compute command is one of a series of cluster compute commands, and the control circuitry, in operation, responds to completion of the series of cluster compute commands by generating control signals to place the memory array in a determined operational state.

9. A system, comprising:
one or more processing cores; and
a memory coupled to the one or more processing cores, the memory including:
a memory array having a first plurality of cells arranged as a plurality of rows of cells intersecting a plurality of columns of cells;
a plurality of first computation circuits where each first computation circuit, in operation, calculates a computation value from cell values in a corresponding column of cells in the first plurality of cells;
a first column multiplexer, which, in operation, cycles through a plurality of data lines that each corresponds to a first computation circuit of the plurality of first computation circuits; and
control circuitry, which, in operation, responds to a cluster compute command by initiating, using a first clock signal, the first column multiplexer to cycle through a determined number of cycles, wherein the first column multiplexer cycles through the determined number of cycles using a second clock signal.

10. The system of claim 9, wherein the cluster compute command is a read command.

11. The system of claim 9, wherein the cluster compute command is a write command.

12. The system of claim 9, wherein the control circuitry, in operation, responds to completion of the determined number of cycles by generating control signals to place the memory array in a determined operational state.

13. The system of claim 12, wherein the determined operational state is one of a low-power state, a retention state, an idle state, a wait state, or a sleep state.

14. The system of claim 9, wherein the control circuitry, in operation, responds to completion of the determined number of cycles by generating control signals to transition the memory through a series of operational states.

15. The system of claim 9, wherein the first clock signal is a system clock signal and the second clock signal is a memory clock signal.

16. The system of claim 9, wherein the cluster compute command is one of a series of cluster compute commands, and the control circuitry, in operation, responds to completion of the series of cluster compute commands by generating control signals to place the memory array in a determined operational state.

17. A method, comprising:
responding to a cluster compute command by initiating, using a first clock signal, a column multiplexer to cycle through a determined number of computational cycles of a memory array having a first plurality of cells arranged as a plurality of rows of cells intersecting a plurality of columns of cells; and
cycling, using the first column multiplexer and a second clock signal, through the determined number of computational cycles, a computational cycle including:
selecting a data line of a plurality of data lines, each data line corresponding to a computational circuit of a plurality of computational circuits;
reading or writing data in memory cells of a column corresponding to the selected data line; and
calculating computational values from cell values in the column corresponding to the selected data line using the computational circuit corresponding to the selected data line.

18. The method of claim 17, wherein the cluster compute command is one of a read command or a write command.

19. The method of claim 17, comprising responding to completion of the determined number of cycles by placing the memory array in a determined operational state.

20. The method of claim 19, wherein the determined operational state is one of a low-power state, a retention state, an idle state, a wait state, or a sleep state.

21. The method of claim 17, comprising responding to completion of the determined number of cycles by transitioning the memory through a series of operational states.

22. The method of claim 17, wherein the first clock signal is a system clock signal and the second clock signal is a memory clock signal.

23. The method of claim 17, wherein the cluster compute command is one of a series of cluster compute commands, comprising responding to completion of the series of cluster compute commands by placing the memory array in a determined operational state.

24. A non-transitory computer-readable medium having contents which configure a processing system to perform a method, the method comprising:
responding to a cluster compute command by initiating, using a first clock signal, a column multiplexer to cycle through a determined number of computational cycles of a memory array having a first plurality of cells arranged as a plurality of rows of cells intersecting a plurality of columns of cells; and
cycling, using the first column multiplexer and a second clock signal, through the determined number of computational cycles, a computational cycle including:
selecting a data line of a plurality of data lines, each data line corresponding to a computational circuit of a plurality of computational circuits;
reading or writing data in memory cells of a column corresponding to the selected data line; and
calculating computational values from cell values in the column corresponding to the selected data line using the computational circuit corresponding to the selected data line.

25. The non-transitory computer-readable medium of claim 24, wherein the method comprises responding to completion of the determined number of cycles by placing the memory array in a determined operational state.

26. The non-transitory computer-readable medium of claim 25, wherein the determined operational state is one of a low-power state, a retention state, an idle state, a wait state, or a sleep state.

27. The non-transitory computer-readable medium of claim 24, wherein the method comprises responding to completion of the determined number of cycles by transitioning the memory through a series of operational states.

28. The non-transitory computer-readable medium of claim 24, wherein the cluster compute command is one of a series of cluster compute commands, and the method comprises responding to completion of the series of cluster compute commands by placing the memory array in a determined operational state.

* * * * *